United States Patent
Yamaguchi et al.

(10) Patent No.: US 12,293,983 B2
(45) Date of Patent: May 6, 2025

(54) CONDUCTIVE PILLAR, METHOD FOR MANUFACTURING THE SAME, AND METHOD FOR MANUFACTURING BONDED STRUCTURE

(71) Applicant: DIC Corporation, Tokyo (JP)

(72) Inventors: Ryota Yamaguchi, Sakura (JP); Makoto Yada, Sakura (JP)

(73) Assignee: DIC CORPORATION, Tokyo (JP)

( * ) Notice: Subject to any disclaimer, the term of this patent is extended or adjusted under 35 U.S.C. 154(b) by 427 days.

(21) Appl. No.: 17/791,652

(22) PCT Filed: Dec. 17, 2020

(86) PCT No.: PCT/JP2020/047075
§ 371 (c)(1),
(2) Date: Jul. 8, 2022

(87) PCT Pub. No.: WO2021/145129
PCT Pub. Date: Jul. 22, 2021

(65) Prior Publication Data
US 2023/0041521 A1    Feb. 9, 2023

(30) Foreign Application Priority Data

Jan. 17, 2020 (JP) ................................. 2020-005885
Mar. 11, 2020 (JP) ................................. 2020-042068

(51) Int. Cl.
H01L 23/00        (2006.01)
(52) U.S. Cl.
CPC .............. *H01L 24/11* (2013.01); *H01L 24/13* (2013.01); *H01L 24/16* (2013.01); *H01L 24/81* (2013.01);
(Continued)

(58) Field of Classification Search
CPC ......... H01L 24/11; H01L 24/13; H01L 24/16; H01L 24/81; H01L 2224/1145;
(Continued)

(56) References Cited

U.S. PATENT DOCUMENTS 9,859,241 B1 *   1/2018   Aoki ....................... H01L 24/11
2005/0061202 A1   3/2005   Hosomi et al.
(Continued)

FOREIGN PATENT DOCUMENTS

JP    2000-297387 A    10/2000
JP    2003-3283 A       1/2003
(Continued)

OTHER PUBLICATIONS

International Search Report dated Mar. 16, 2021, issued in counterpart International Application No. PCT/JP2020/047075 (2 pages).
(Continued)

*Primary Examiner* — Douglas W Owens
(74) *Attorney, Agent, or Firm* — WHDA, LLP

(57) ABSTRACT

Provided is a method for manufacturing a conductive pillar capable of bonding a substrate and a bonding member with high bonding strength via a bonding layer without employing an electroplating method, and a method for manufacturing a bonded structure by employing this method. A method for manufacturing a conductive pillar 1 includes, in sequence, the steps of forming a resist layer 16 on a substrate 11 provided with an electrode pad 13, the resist layer 16 including an opening portion 16a on the electrode pad 13, forming a thin Cu film 17 by sputtering or evaporating Cu on a surface of the substrate 11 provided with the resist layer 16 including the opening portion 16a, filling the opening portion 16a with a fine particle copper paste 12c, and sintering the fine particle copper paste 12c by heating the substrate 11 filled with the fine particle copper paste 12c.

6 Claims, 10 Drawing Sheets

(52) U.S. Cl.
CPC .......... *H01L 2224/1145* (2013.01); *H01L 2224/1147* (2013.01); *H01L 2224/11505* (2013.01); *H01L 2224/1181* (2013.01); *H01L 2224/13019* (2013.01); *H01L 2224/13082* (2013.01); *H01L 2224/13147* (2013.01); *H01L 2224/16227* (2013.01); *H01L 2224/81815* (2013.01)

(58) Field of Classification Search
CPC ... H01L 2224/1147; H01L 2224/11505; H01L 2224/1181; H01L 2224/13019; H01L 2224/13082; H01L 2224/16227; H01L 24/14; H01L 2224/11312; H01L 2224/11332; H01L 2224/11502; H01L 2224/13018; H01L 2224/1357; G03F 7/40
See application file for complete search history.

(56) References Cited

U.S. PATENT DOCUMENTS

| | | |
|---|---|---|
| 2011/0001250 A1 | 1/2011 | Lin et al. |
| 2011/0003470 A1* | 1/2011 | Burgess .......... H01L 24/11 257/E21.589 |
| 2015/0144591 A1 | 5/2015 | Takahashi et al. |
| 2015/0155255 A1 | 6/2015 | Aoki et al. |
| 2016/0056116 A1 | 2/2016 | Aoki et al. |
| 2016/0329444 A1 | 11/2016 | Koike et al. |
| 2017/0005053 A1 | 1/2017 | Horibe et al. |
| 2018/0061796 A1 | 3/2018 | Aoki et al. |
| 2018/0061797 A1 | 3/2018 | Aoki et al. |
| 2018/0076162 A1 | 3/2018 | Horibe et al. |
| 2020/0058612 A1 | 2/2020 | Aoki et al. |
| 2020/0152590 A1 | 5/2020 | Aoki et al. |
| 2021/0125950 A1* | 4/2021 | Hisada .......... H01L 24/11 |
| 2022/0293543 A1* | 9/2022 | Yamaguchi .......... H05K 1/09 |

FOREIGN PATENT DOCUMENTS

| | | |
|---|---|---|
| JP | 2005-213526 A | 8/2005 |
| JP | 2006-9122 A | 1/2006 |
| JP | 2006-13340 A | 1/2006 |
| JP | 2009-149971 A | 7/2009 |
| JP | 2015-106617 A | 6/2015 |
| JP | 2015-120970 A | 7/2015 |
| JP | 2015-122435 A | 7/2015 |
| JP | 2015-135974 A | 7/2015 |
| JP | 2016-115846 A | 6/2016 |
| JP | 6168837 B2 | 7/2017 |
| JP | 6316683 B2 | 4/2018 |

OTHER PUBLICATIONS

Notice of Reasons for Refusal dated Oct. 5, 2021, issued in counterpart JP Patent Application No. 2021-549079, w/English translation (10 pages).
Notice of Reasons for Refusal dated Feb. 1, 2022, issued in counterpart JP Patent Application No. 2021-549079, w/English translation (11 pages).

* cited by examiner

CONDUCTIVE PILLAR, METHOD FOR MANUFACTURING THE SAME, AND METHOD FOR MANUFACTURING BONDED STRUCTURE

TECHNICAL FIELD

The present invention relates to a conductive pillar, a method for manufacturing the same, and a method for manufacturing a bonded structure.

BACKGROUND ART

Hitherto, a flip-chip mounting method has been used as a method for electrically connecting a semiconductor chip and a semiconductor substrate. The flip-chip mounting method is a method in which bumps are formed on electrode pads disposed on a semiconductor chip, the semiconductor chip and a semiconductor substrate are disposed to face each other with the bumps provided therebetween, and bonding is accomplished by melting the bumps under heating. In the flip-chip mounting method, conductive pillars may be formed on electrode pads disposed on a semiconductor chip with underlying plating layers, which are called seed layers, provided therebetween, and bumps may be formed on the conductive pillars.

As conductive pillars formed on electrode pads with underlying plating layers provided therebetween, there are copper pillars. Hitherto, the copper pillars have been formed by the following method. Underlying plating layers and resist layers are formed in that order on a semiconductor chip having electrode pads. Each of the resist layers is partially removed to expose a corresponding one of the underlying plating layers on the electrode pads. Subsequently, copper pillars are formed by an electroplating method on the underlying plating layers. Thereafter, the resist layers are removed, and the underlying plating layers disposed under the resist layers are removed by etching (for example, see Patent Literature 1).

A method for forming copper pillars using a copper paste as a raw material without employing the electroplating method has also been reported (see, for example, Patent Literature 2).

CITATION LIST

Patent Literature

PTL 1: Japanese Unexamined Patent Application Publication No. 2015-135974
PTL 2: U.S. Pat. No. 9,859,241

SUMMARY OF INVENTION

Technical Problem

In the method for forming copper pillars using the electroplating method, however, the cost of installing facilities to employ the electroplating method is large, and a large amount of waste liquid needs to be recycled or disposed of, thus resulting in a high environmental burden.

In the method for forming a copper pillar with a copper paste as a raw material without employing an electroplating method, aluminum or a metal species mainly containing aluminum is typically used as a metal material for electrodes on a side of a substrate adjacent to a semiconductor chip. Aluminum is very easily oxidized, and an oxide film is instantaneously formed. It is thus difficult to bond the copper paste under no-pressure conditions because the oxide film inhibits bonding with copper. In the case where copper pillars made from a copper paste as a raw material are formed on a semiconductor chip and where the semiconductor chip and a semiconductor substrate are electrically connected with bumps formed thereon, sufficient bonding strength between the semiconductor chip and the semiconductor substrate is not obtained, in some cases. Thus, there has been a need for conductive pillars capable of bonding a semiconductor chip and a semiconductor substrate with high bonding strength using bonding layers, such as bumps, provided therebetween.

The present invention has been made in light of the above circumstances and aims to provide a conductive pillar that is disposed on a substrate of, for example, a semiconductor chip, and that can bond the substrate and a bonding member with high bonding strength via a bonding layer, and a method for manufacturing the conductive pillar.

The present invention also aims to provide a method for manufacturing a bonded structure which includes a conductive pillar of the present invention and in which a substrate and a bonding member can be bonded to each other with high bonding strength, and to provide a method for manufacturing an electronic device.

Solution to Problem

[1] A method for manufacturing a conductive pillar includes, in sequence, the steps of:
  forming a resist layer on a substrate provided with an electrode pad, the resist layer including an opening portion on the electrode pad;
  forming a thin Cu film by sputtering or evaporating Cu on a surface of the substrate provided with the resist layer including the opening portion;
  filling the opening portion with a fine particle copper paste; and
  sintering the fine particle copper paste by heating the substrate filled with the fine particle copper paste.

[2] A method for manufacturing a conductive pillar including an electrode pad, a first bonding layer formed of a thin Cu film on the electrode pad, and a sintered body of fine copper particles on the first bonding layer includes, in sequence, the steps of:
  forming a thin Cu film by sputtering or evaporating Cu on a surface of a substrate provided with an electrode pad;
  forming a resist layer on the thin Cu film, the resist layer including an opening portion above the electrode pad;
  filling the opening portion with a fine particle copper paste; and
  sintering the fine particle copper paste by heating the substrate filled with the fine particle copper paste.

[3] The method for manufacturing a conductive pillar described in [1] or [2] further includes, after the step of sintering the fine particle copper paste, a step of removing a residue of the fine particle copper paste left on an outermost layer over the substrate.

[4] In the method for manufacturing a conductive pillar described in [3], the step of removing the residue of the fine particle copper paste is wet etching.

[5] The method for manufacturing a conductive pillar described in any one of [1] to [4] further includes, after the step of sintering the fine particle copper paste, a step of removing the resist layer and the exposed thin Cu film.

[6] A method for manufacturing a bonded structure includes a step of bonding a substrate provided with the electrode pad, a conductive pillar formed by the method according to any one of [1] to [5], a second bonding layer, and a bonding member, in this order.

[7] A conductive pillar is formed of a sintered body of fine metal particles disposed on a substrate, in which the sintered body has an upper surface with a concave shape recessed toward the substrate, and
the sintered body has a side surface covered with a thin Cu film.

Advantageous Effects of Invention

According to the method for manufacturing a conductive pillar of the present invention, it is possible to manufacture a conductive pillar capable of bonding a substrate and a bonding member with high bonding strength via a bonding layer without employing an electroplating method.

According to the method for manufacturing a bonded structure of the present invention, it is possible to manufacture a bonded structure in which a substrate and a bonding member can be bonded to each other with high bonding strength via a bonding layer without employing an electroplating method, and to manufacture an electronic device including the bonded structure.

DESCRIPTION OF EMBODIMENTS

Figure 1A:
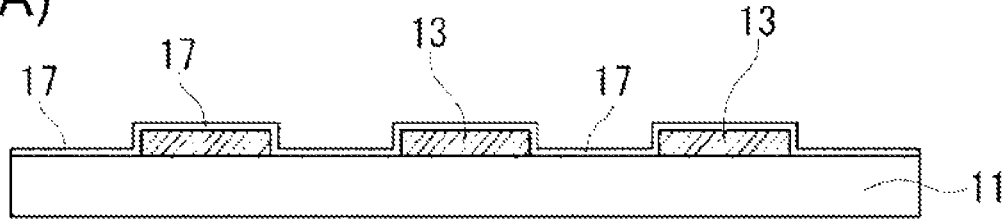
FIGS. 1(A) to 1(D) are process diagrams illustrating an example of a method for manufacturing a conductive pillar of the present embodiment.

A conductive pillar, a bonded structure, an electronic device, and a method for manufacturing a conductive pillar of the present invention will be described in detail below with reference to the drawings. In the drawings used in the following description, characteristic portions may be enlarged for convenience in order to facilitate understanding of the features of the present invention. Thus, the dimensional ratio and so forth of each component may differ from the actual one.

<<Method for Manufacturing Conductive Pillar>>

FIGS. 1(A) to 1(D) and FIGS. 3(A) to 3(D) are process diagrams illustrating an example of a method for manufacturing a conductive pillar. For convenience of explanation, a method for manufacturing a conductive pillar illustrated in FIGS. 1(A) to 1(D) is described as a first embodiment. A method for manufacturing a conductive pillar illustrated in FIGS. 3(A) to 3(D) is described as a second embodiment. Each method for manufacturing a conductive pillar according to the present invention will be described in detail below.

First Embodiment

FIGS. 1(A) to 1(D) illustrate an example of a method for manufacturing a conductive pillar of the present embodiment.

Figure 1B:
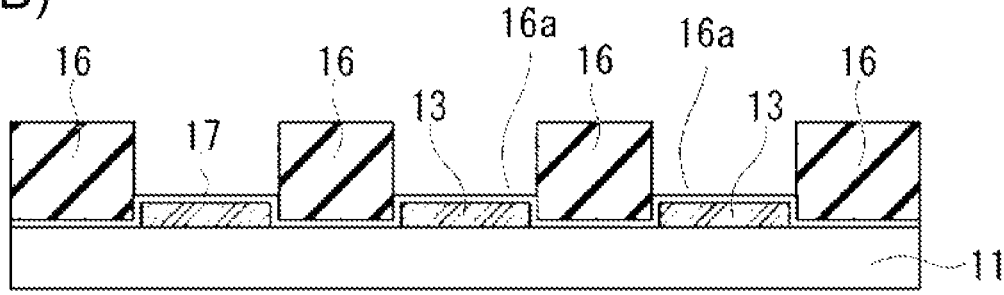
Figure 1C:
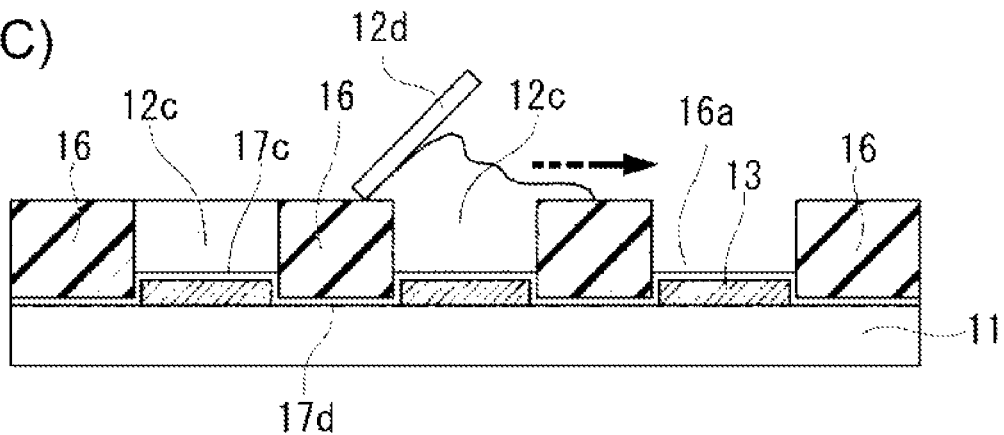
Figure 1D:
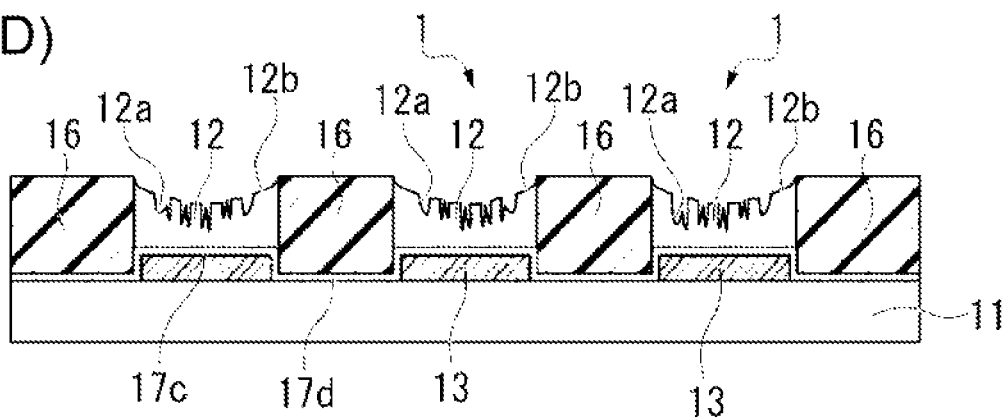

A method for manufacturing a conductive pillar of the present embodiment, the conductive pillar including an electrode pad, a first bonding layer formed of a thin Cu film on the electrode pad, and a sintered body of fine copper particles on the first bonding layer, includes, in sequence, the steps of:

forming a thin Cu film by sputtering or evaporating Cu on a surface of a substrate provided with an electrode pad (FIG. 1(A));
forming a resist layer on the thin Cu film, the resist layer including an opening portion above the electrode pad (FIG. 1(B));
filling the opening portion with a fine particle copper paste (FIG. 1(C)); and
sintering the fine particle copper paste by heating the substrate filled with the fine particle copper paste (FIG. 1(D)).

Second Embodiment

FIGS. 3(A) to 3(D) illustrate side views illustrating an example of a method for manufacturing a conductive pillar of the present embodiment.

Figure 3A:
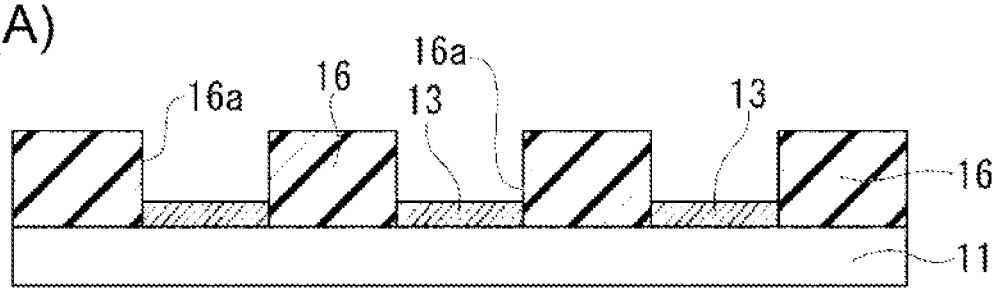
FIGS. 3(A) to 3(D) are process diagrams illustrating an example of a method for manufacturing a conductive pillar of the present embodiment.
Figure 3B:
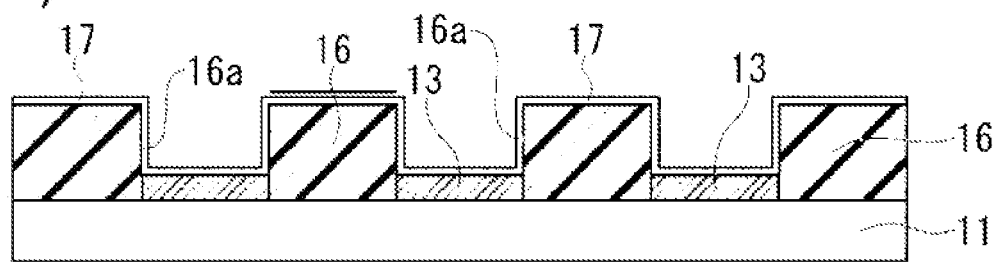
Figure 3C:
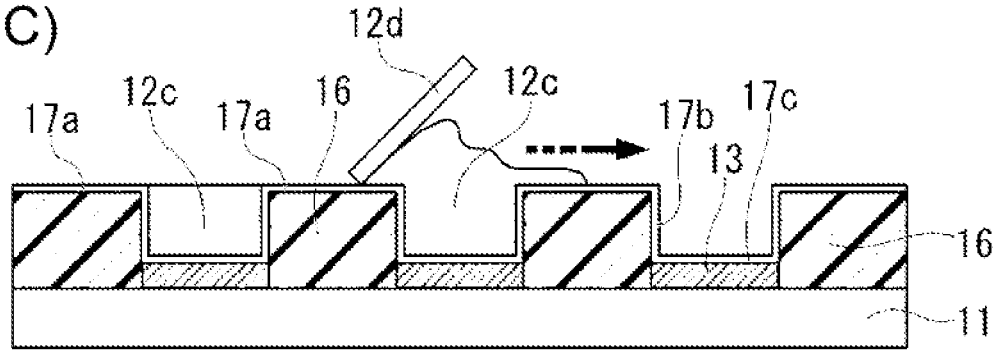
Figure 3D:
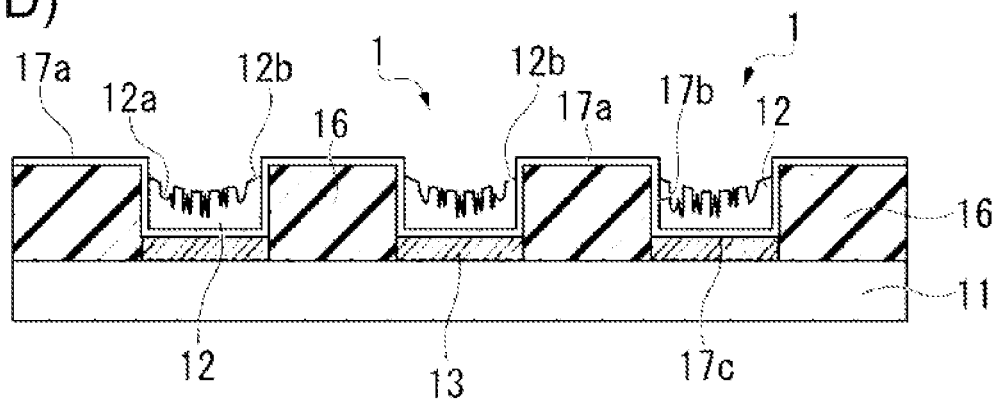

A method for manufacturing a conductive pillar of the present embodiment includes, in sequence, the steps of:

forming a resist layer on a substrate provided with an electrode pad, the resist layer including an opening portion on the electrode pad (FIG. 3(A));
forming a thin Cu film by sputtering or evaporating Cu on a surface of the substrate provided with the resist layer including the opening portion (FIG. 3(B));
filling the opening portion with a fine particle copper paste (FIG. 3(C)); and
sintering the fine particle copper paste by heating the substrate filled with the fine particle copper paste (FIG. 3(D)).

<Step of Forming Thin Cu Film>

In the step of forming the thin Cu film in the first embodiment, Cu is sputtered or evaporated onto the surface of the substrate provided with electrode pads 13 to form a thin Cu film 17 (see FIG. 1(A)). In the present embodiment, the electrode pads 13 are provided on a substrate 11. Thus, as illustrated in FIG. 1(A), the thin Cu film 17 is formed not only on the exposed surface of the substrate 11, but also on the surfaces of the electrode pads 13 on the substrate 11.

In the step of forming the thin Cu film in the second embodiment, Cu is sputtered or evaporated onto a surface of a substrate provided with a resist layer 16 including opening portions 16a to form a thin Cu film 17 (see FIG. 3(B)). In the present embodiment, the resist layer 16 includes the opening portions 16a located on the electrode pads 13. Thus, as illustrated in FIG. 3(B), the thin Cu film 17 is formed not only on the surface of the resist layer 16, but also on the upper surfaces of the electrode pads 13, exposed through the opening portions 16a, on the substrate 11.

The thickness of a thin Cu film 17a on the upper portion of the resist layer is substantially equal to the thickness of thin Cu films 17c on the electrode pads. The thickness of thin Cu films 17b on the side surfaces of the resist layer in the opening portions is smaller than the thickness of the thin Cu film 17a on the upper portion of the resist layer and the thickness of the thin Cu films 17c on the electrode pads. However, the thickness of the thin Cu films 17b on the side surfaces of the resist layer in the opening portions can be substantially equal to the thickness of the thin Cu film 17a on the upper portion of the resist layer and the thin Cu films 17c on the electrode pads when the substrate is tilted and rotated during sputtering.

Examples of the substrate 11 provided with the electrode pads 13 include, but are not particularly limited to, semiconductor material substrates, such as semiconductor chips, semiconductor wafers, and interposers provided with freely-selected electrical circuits. As the material of the substrate 11, for example, a known material used for the substrate 11 can be used. Examples thereof include metals, such as copper, ceramic materials, silicon, resins, and composite materials thereof. As the material of the electrode pads 13, a conductive material composed of a metal, such as Ti, Cu, Al, or Au or an alloy, can be used. Each of the electrode pads 13 may have a single-layer structure composed of a single material or may have a multilayer structure composed of two or more materials. The outermost layer of each electrode pad 13 in contact with the thin Cu film is preferably a layer containing titanium because the wettability with the thin Cu film, that is, adhesion, is improved and stable conductive pillars can be formed. Examples thereof include a single-layer structure of a Ti film; and multilayer structures, such as titanium-tungsten alloy/copper (TiW/Cu), titanium/copper (Ti/Cu), titanium/copper/nickel-gold (Ti/Cu/NiAu), and titanium/titanium nitride/titanium (Ti/TiN/Ti).

Cu can be sputtered with a commercially available sputtering apparatus onto a surface of a substrate provided with electrode pads or a resist layer including opening portions to form the thin Cu film 17. Specifically, an inert gas such as Ar is introduced in a vacuum. A negative voltage is applied to a Cu target to generate a glow discharge, thereby ionizing inert gas atoms. The gas ions collide with the surface of the target at a high speed to violently hit the surface of the target. Cu atoms of the Cu target are violently ejected to adhere and deposit on the surface of the substrate provided with the electrode pads or the surface of the substrate provided with the resist layer including the opening portions, thereby forming a thin Cu film.

A thin Cu film can be formed with a commercially available vacuum vapor deposition apparatus by evaporating Cu onto a surface of a substrate provided with electrode pads or onto a surface of a substrate provided with a resist layer including opening portions. Specifically, when an evaporation material of Cu is placed on a heat generation source (evaporation source) in a vacuum evaporation apparatus and heated in a vacuum, the heated evaporation material of Cu vaporizes or sublimates. Cu atoms scattered in the vacuum inside the evaporation apparatus adhere (vapor-deposit) to a surface of a substrate provided with electrode pads or a surface of a substrate provided with a resist layer including opening portions, thereby forming a thin Cu film.

The thickness of the thin Cu film 17 can be easily adjusted in the range of 3 to 3,000 nm, and is preferably 3 to 3,000 nm, more preferably 10 to 2,000 nm, particularly preferably 50 to 1,000 nm.

The thin Cu film 17 may have a single-layer structure or may have a multilayer structure composed of two or more materials as long as a thin Cu layer can be formed as the outermost layer.

For example, in the case where the electrode pads 13 are composed of an easily oxidizable metal, such as aluminum, when a thin Cu film is formed directly on the electrode pads 13, it is necessary to prevent the formation of oxide films on the electrode pads 13 or to remove the oxide films in order to easily increase the bonding strength between the electrode pads 13 and conductive pillars 1. The bonding strength between the electrode pads 13 and the conductive pillars 1 may be easily increased by forming a thin Ti film on each electrode pad 13 composed of aluminum and then forming a thin Cu film on the thin Ti film, rather than forming thin Cu film directly on the electrode pads 13 composed of aluminum.

Regarding the formation of the thin Ti film, the thin Cu film can be formed by sputtering or evaporating Ti in the same manner as the formation of the thin Cu film, except that the Cu target in the formation of the thin Cu film is changed to a Ti target.

The thickness of the thin Ti film can be easily adjusted in the range of 3 to 600 nm and is preferably 3 to 600 nm, more preferably 10 to 400 nm, particularly preferably 50 to 200 nm.

In a conventional method for forming a copper pillar on an underlying plating layer using an electroplating method, a potential must be applied to a Cu layer as the underlying plating layer, and a current must be passed therethrough; thus, the Cu layer is required to have low electrical resistance. For this reason, conventionally, a thick underlying plating layer is provided on the entire surface of a substrate under a resist layer. In the method for manufacturing a conductive pillar according to the present embodiment, the thin Cu film functions as a first bonding layer between the electrode pads and the copper pillars. Unlike the electroplating method, it is not necessary to allow a current to flow. Thus, the thickness of the thin Cu film can be reduced. A reduction in the thickness of the thin Cu film has the advantages that the time required to remove the thin Cu film by etching can be significantly shortened and the amount of etching agent used can be reduced. In particular, in the method for manufacturing a conductive pillar according to the second embodiment, the thin Cu film is formed on the surface of the substrate provided with the resist layer including the opening portions; thus, it is possible to prevent the formation of undercuts, which have been a problem in the related art in the step of removing the resist layer after the step of sintering the fine particle copper paste. Even when each of the electrode pads 13 has a multilayer structure composed of two or more metal materials, such as Ti and Al, the formation of the undercuts can be prevented.

<Step of Forming Resist Layer>

Regarding the resist layer, the patterning of the resist layer 16 can partially remove the resist layer 16 to form the opening portions 16a, which are cylindrical recesses, for exposing the electrode pads 13 (see FIGS. 1(B) and 3(A)). As a method for patterning the resist layer 16, a known method can be used. The opening portions 16a function as a mold for manufacturing sintered bodies 12.

The resist layer 16 in FIG. 1(B) can have a shape such that the opening portions 16a are located on the thin Cu film 17 and above the electrode pads 13.

The resist layer 16 in FIG. 3(A) can have a shape such that the opening portions 16a are located on the electrode pads 13 on the substrate 11.

As the material of the resist layer 16, various dry films, such as a photo-resist, polyimide, epoxy, and an epoxy-molding compound (EMC), can be used.

The opening portions 16a have a substantially cylindrical shape. The substantially cylindrical shape of the opening portions 16a results in good bondability between the sintered bodies 12 and the first bonding layers and between the sintered bodies 12 and bonding layers described below (second bonding layers), and the substrate 11 and the bonding member to be bonded to the substrate 11 are bonded to each other with higher bonding strength, which is preferred.

When each of the opening portions 16a has a substantially cylindrical shape, the size of each opening portion 16a and the size of each of the conductive pillars 1 that can be formed therewith can be represented by the diameter of the lower surface of each of the cylinders. To cope with the miniaturization of bonded structures due to the miniaturization of electronic devices, the diameter is preferably 100 µm or less, more preferably 50 µm or less, particularly preferably 30 µm or less. The size of each opening portion 16a and the size of each conductive pillar 1 preferably each have a diameter of 5 µm or more, more preferably 10 µm or more, even more preferably 20 µm or more because of better bondability with the first bonding layer and the second bonding layer described below and better conductivity. The diameter of the lower surface of the cylinder is preferably 5 to 100 µm, more preferably 10 to 50 µm, even more preferably 20 to 30 µm.

The planar shape of each opening portion 16a is not limited to a substantially circular shape and can be appropriately determined in accordance with, for example, the planar shape of each electrode pad 13. The planar shape of the opening portion 16a may be polygonal shape, such as a substantially rectangular shape, or may be, for example, a substantially elliptical shape or a substantially oval shape. In this case, the size of the opening portion 16a and the size of the conductive pillar 1 that can be formed therewith can be represented by the equivalent circular diameter of the planar shape, and the preferable equivalent circular diameter is the same as the diameter of the lower surface of the cylinder. The planar shape of the sintered body 12 can thus be formed into, for example, a polygonal shape, such as a substantially rectangular shape, a substantially elliptical shape, or a substantially oval shape, and the size of the sintered body 12 can be controlled.

That is, when each of the opening portions 16a has a columnar shape, the size of each opening portion 16a and the size of each of the conductive pillars 1 that can be formed therewith can be represented by the equivalent circular diameter of the lower surface of the columnar shape. To cope with the miniaturization of bonded structures due to the miniaturization of electronic devices, the equivalent circular diameter is preferably 100 µm or less, more preferably 50 µm or less, particularly preferably 30 µm or less. The size of each opening portion 16a and the size of each conductive pillar 1 preferably each have an equivalent circular diameter of 5 µm or more, more preferably 10 µm or more, even more preferably 20 µm or more because of better bondability with the first bonding layer and the second bonding layer described below and better conductivity. The equivalent circular diameter is preferably 5 to 100 µm, more preferably 10 to 50 µm, even more preferably 20 to 30 µm.

<Step of Filling Fine Particle Copper Paste>

The opening portions 16a are filled with fine particle copper paste 12c with a squeegee 12d to form columnar bodies composed of the fine particle copper paste 12c on the substrate 11 provided with the electrode pads 13 (see FIGS. 1(C) and 3(C)).

The fine particle copper paste 12c may be filled into the opening portions 16a in an inert gas atmosphere, such as an argon gas atmosphere, or a reducing gas atmosphere. In this case, the fine copper particles contained in the fine particle copper paste 12c are less likely to be oxidized, which is preferred.

As the squeegee 12d used for filling the fine particle copper paste 12c, for example, a squeegee composed of a plastic material, rubber such as urethane rubber, a ceramic material, or a metal can be used.

A method for filling the fine particle copper paste 12c into the opening portions 16a is not limited to the method using the squeeze 12d. Examples of the method that may be used include a doctor blade method, a dispenser method, an ink jet method, a press-injection method, a vacuum printing method, and a pressing method using pressure.

The (fine particle copper paste) that can be used in the <step of filling fine particle copper paste> will be described below.

(Fine Particle Copper Paste)

In the present embodiment, as the fine particle copper paste 12c to be filled into the opening portions 16a, a paste containing fine copper particles having an average primary particle size of less than 1 µm is preferably used. As the fine particle copper paste 12c, for example, a mixture of fine copper particles having an average primary particle size of less than 1 µm, a solvent, and, if necessary, a dispersant, a protective agent, and other additives, can be used. The fine copper particles and the dispersant may be contained in the fine particle copper paste 12c in the form of a composite of the copper fine particles and the dispersant. The fine copper particles and the protective agent may be contained in the fine particle copper paste 12c in the form of a composite of the fine copper particles and the protective agent. The fine particle copper paste 12c can be prepared, for example, by mixing materials to be the fine particle copper paste 12c by a known method. Hereinafter, the composite of the fine copper particles and the dispersant and the composite of the fine copper particles and the protective agent are collectively referred to as a "fine particle copper composite".

The average primary particle size of the fine copper particles and the average primary particle size of the fine particle copper composite are preferably less than 1 µm, more preferably 500 nm or less, even more preferably 100 nm or less. The average primary particle size of the fine copper particles and the average primary particle size of the fine particle copper composite are preferably 10 nm or more and less than 1 µm, more preferably 20 nm or more and 500 nm or less, even more preferably 30 nm or more and 100 nm or less.

The shape of the fine copper particles contained in the fine particle copper paste 12c is not limited to a particular shape. For example, as the fine copper particles, spherical or flake-shaped fine copper particles can be used.

In the present embodiment, the average primary particle size of the fine copper particles used as the material of the conductive pillars 1 is appropriately determined in such a manner that the average particle size of the fine copper particles contained in the sintered bodies 12 (conductive pillars 1) after sintering, measured by small-angle X-ray scattering (hereinafter, also referred to as "SAXS"), falls within a predetermined range. For example, in the case of manufacturing the conductive pillars 1 formed of the sintered bodies 12 of the fine copper particles having an average particle size, measured by SAXS, is less than 1 μm, the average primary particle size of the fine copper particles contained in the fine particle copper paste 12c is set to less than 1 μm. In the case of manufacturing the conductive pillars 1 formed of the sintered bodies 12 of the fine copper particles having an average particle size, measured by SAXS, of 100 nm or less, the average primary particle size of the fine copper particles contained in the fine particle copper paste 12c is set to 100 nm or less.

In the present embodiment, the phrase "the particle size of the fine copper particles used as the material of the conductive pillars 1 is less than 1 μm" indicates that the average primary particle size of the fine copper particles is less than 1 μm.

When the fine copper particles contained in the fine particle copper paste 12c are contained in the form of a composite of the fine copper particles and a dispersant and/or a composite of the fine copper particles and a protecting agent, the average primary particle size of the composite is regarded as the average primary particle size of the fine copper particles.

The average primary particle size of the fine copper particles used as the material of the conductive pillars 1 can be calculated by observation with a transmission electron microscope (TEM).

In the present embodiment, a value calculated by analyzing an image of a photograph taken using the transmission electron microscope (TEM) is used as the average primary particle size of the fine copper particles used as the material of the conductive pillars 1.

Specifically, a dispersion containing fine copper particles dispersed in a solvent at a freely-selected concentration is cast on a carbon film-coated grid and dried to remove the solvent, thereby preparing a sample for observation with the transmission electron microscope (TEM). Then 200 fine particles are randomly selected from the obtained TEM images. The area of each of the selected fine particles is determined. The particle size in terms of a true sphere is calculated on a number basis and is used as the average primary particle size. From the randomly extracted fine copper particles, two particles overlapping each other are excluded. When a large number of particles are aggregated by contact or secondary aggregation, the fine copper particles constituting the aggregates are treated as independent particles. For example, when five primary particles are in contact with each other or secondarily aggregated to form one aggregate, each of the five particles constituting the aggregate is a calculation target of the average primary particle size of the fine copper particles.

As the solvent contained in the fine particle copper paste 12c, it is preferable to use a solvent that do not aggregate the fine copper particles (composites when the fine copper particles are composites with a dispersant and/or composites with a protecting agent) contained in the fine particle copper paste 12c in order to prepare a fine particle copper paste 12c containing the fine copper particles uniformly dispersed. As the solvent, one or more hydroxy group-containing solvents may be used. One or more hydroxy group-free solvents may be used. A mixture of a hydroxy group-containing solvent and a hydroxy group-free solvent may be used.

Examples of the hydroxy group-containing solvents include water, methanol, ethanol, 1-propanol, isopropanol, 1-butanol, isobutanol, sec-butanol, tert-butanol, amyl alcohol, tert-amyl alcohol, 1-hexanol, cyclohexanol, benzyl alcohol, 2-ethyl-1-butanol, 1-heptanol, 1-octanol, 4-methyl-2-pentanol, neopentyl glycol, ethylene glycol, propylene glycol, 1,3-butanediol, 1,4-butanediol, 2,3-butanediol, isobutylene glycol, 2,2-dimethyl-1,3-butanediol, 2-methyl-1,3-pentanediol, 2-methyl-2,4-pentanediol, diethylene glycol, triethylene glycol, tetraethylene glycol, 1,5-pentanediol, 2,4-pentanediol, dipropylene glycol, 2,5-hexanediol, glycerin, diethylene glycol monobutyl ether, ethylene glycol monobenzyl ether, ethylene glycol monoethyl ether, ethylene glycol monomethyl ether, ethylene glycol monophenyl ether, and propylene glycol dimethyl ether.

Examples of the hydroxy group-free solvents include acetone, cyclopentanone, cyclohexanone, acetophenone, acrylonitrile, propionitrile, n-butyronitrile, isobutyronitrile, γ-butyrolactone, ε-caprolactone, propiolactone, 2,3-butylene carbonate, ethylene carbonate, 1,2-ethylene carbonate, dimethyl carbonate, ethylene carbonate, dimethyl malonate, ethyl lactate, methyl benzoate, methyl salicylate, ethylene glycol diacetate, ε-caprolactam, dimethyl sulfoxide, N,N-dimethylformamide, N,N-dimethylacetamide, N-methylformamide, N-methylacetamide, N-ethylacetamide, N,N-diethylformamide, formamide, pyrrolidine, 1-methyl-2-pyrrolidinone, hexamethylphosphoric triamide, and naphthalene.

Examples of the additives contained in the fine particle copper paste 12c include silicon-based leveling agents, fluorine-based leveling agents, and defoaming agents.

As the dispersant contained in the fine particle copper paste 12c, for example, a thioether-type organic compound can be used. Examples of the thioether-type organic compound suitable as the dispersant include ethyl 3-(3-(methoxy(polyethoxy)ethoxy)-2-hydroxypropylsulfanyl)propionate [an addition compound of ethyl 3-mercaptopropionate to polyethylene glycol methyl glycidyl ether (molecular weight of polyethylene glycol chain: 200 to 3,000 (8 to 136 carbon atoms)] represented by formula (1) below.

[Chem. 1]

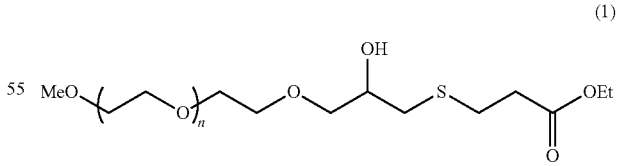

(1)

(In formula (1), Me is a methyl group, Et is an ethyl group, and n is 200 to 3,000).

The compound represented by formula (1) is an addition compound of ethyl 3-mercaptopropionate to polyethylene glycol methyl glycidyl ether, and the molecular weight of the polyethylene glycol chain in the polyethylene glycol methyl glycidyl ether is 200 to 3,000 (8 to 136 carbon atoms). Specific examples of the compound represented by formula (1) include compounds each containing the polyethylene glycol chain having a molecular weight of 200 (8 carbon atoms), 1,000 (46 carbon atoms), 2,000 (91 carbon atoms), or 3,000 (136 carbon atoms).

When the molecular weight of the polyethylene glycol chain in the polyethylene glycol methyl glycidyl ether is 200 or more, the fine copper particles can be satisfactorily dispersed in the solvent to suppress aggregation due to poor dispersion. When the molecular weight is 3,000 or less, the dispersant is not easily left in the sintered bodies 12 formed by sintering the fine particle copper paste 12c. This results in good wettability of the sintered bodies 12 with respect to a material to be the second bonding layer described below, so that the material to be the second bonding layer is easily filled into multiple groove portions 12a of the sintered bodies 12 to easily form anchor portions.

The compound represented by formula (1) forms a composite with the fine copper particles. The composite of the compound represented by formula (1) and the fine copper particles is dispersed easily and uniformly in a solvent, such as water or ethylene glycol. Accordingly, the use of the composite of the compound represented by formula (1) and the fine copper particles easily provides the fine particle copper paste 12c containing the fine copper particles uniformly dispersed. The use of the fine particle copper paste 12c containing the fine copper particles uniformly dispersed results in the conductive pillars 1 having stable characteristics and containing the fine copper particles uniformly arranged.

The composite of the fine copper particles and the dispersant can be produced, for example, by a method in which the fine copper particles and the dispersant are mixed and reacted. Examples of the composite of the fine copper particles and the dispersant include composite [1] and composite [2] produced by methods described below. Composite [1] and composite [2] may be purified as needed and then used as materials for the fine particle copper paste 12c.

(Production of Composite [1])

A mixture of copper(II) acetate monohydrate, a compound represented by formula (1) as a dispersant, and ethylene glycol is deaerated by heating under stirring with nitrogen blown thereinto, and then the mixture is brought to room temperature. A hydrazine solution prepared by diluting hydrazine hydrate with water is added dropwise to the mixture that has been brought to room temperature, thereby reducing copper.

Through the steps described above, composite [1] of fine copper particles composed of copper and the dispersant of the compound represented by formula (1) is produced.

(Production of Composite [2])

Copper nitrate, and octylamine and linoleic acid as protective agents are mixed and dissolved in trimethylpentane under stirring to prepare a mixed solution. A propanol solution containing sodium borohydride is then added dropwise to the mixed solution to reduce copper.

Through the steps described above, composite [2] of fine copper particles composed of copper and the protective agent composed of an organic substance is produced as a black solid.

In the present embodiment, after the opening portions 16a are filled with the fine particle copper paste 12c to form the columnar bodies and before the columnar bodies are sintered to form the sintered bodies 12, it is preferable to perform a step of exposing at least surfaces (upper surfaces in FIGS. 1(C) and 3(C)) of the columnar bodies to an oxygen-containing atmosphere having an oxygen concentration of 200 ppm or more. This oxidizes the fine copper particles that are contained in the fine particle copper paste 12c and that form the surfaces of the columnar bodies.

The oxygen-containing atmosphere to which at least the surfaces of the columnar bodies are exposed preferably has an oxygen concentration of 200 ppm or more, more preferably 1,000 ppm or more. An oxygen concentration in the oxygen-containing atmosphere of 200 ppm or more is preferred because it promotes oxidation of the fine copper particles that are contained in the fine particle copper paste 12c and that form the surfaces of the columnar bodies and reduces the time that at least the surfaces of the columnar bodies are exposed to the oxygen-containing atmosphere.

The oxygen-containing atmosphere to which at least the surfaces of the columnar bodies are exposed preferably has an oxygen concentration of 30% or less, more preferably 25% or less, even more preferably less than or equal to the oxygen concentration (20.1%) in the atmosphere. An oxygen concentration in the oxygen-containing atmosphere of 30% or less can prevent excessive oxidation of the fine copper particles contained in the fine particle copper paste 12c that forms the columnar bodies.

The exposure time for which at least the surfaces of the columnar bodies are exposed to the oxygen-containing atmosphere having an oxygen concentration of 200 ppm or more can be appropriately determined in accordance with, for example, the exposure temperature and the type of fine copper particles contained in the fine particle copper paste 12c. The exposure time is not particularly limited. For example, in the case of exposure to an oxygen-containing atmosphere having an oxygen concentration of 200 ppm or more in an environment with a temperature of 25° C., the exposure time is preferably in the range of 1 minute to 180 minutes, more preferably in the range of 3 minutes to 60 minutes. An exposure time of 1 minute or more results in sufficient oxidation of the fine copper particles contained in the fine particle copper paste 12c forming the surfaces of the columnar bodies. As a result, the multiple groove portions 12a having sufficient depth and number are formed by sintering the columnar bodies, which is preferred. An exposure time of 180 minutes or less can prevent excessive oxidation of the fine copper particles contained in the fine particle copper paste 12c forming the surfaces of the columnar bodies.

When the fine copper particles contained in the columnar bodies are excessively oxidized before the columnar bodies are sintered to form the sintered bodies 12, the sintered bodies 12 obtained after sintering may have insufficient conductivity. When the fine copper particles contained in the columnar bodies are excessively oxidized, the sintered bodies 12 may be reduced by a conventionally known method as necessary after the sintered bodies 12 are formed.

An example of the oxygen-containing atmosphere having an oxygen concentration of 200 ppm or more is the atmosphere.

<Step of Sintering Fine Particle Copper Paste>

When the columnar bodies composed of the fine particle copper paste 12c are sintered, the sintered bodies 12 having the upper surfaces 12b with a concave shape recessed toward the substrate 11 can be formed on the substrate 11 (see FIGS. 1(D) and 3(D)).

The concave shape of the sintered bodies 12 is presumed to be formed as follows: when the columnar bodies composed of the fine particle copper paste 12c are sintered, while the columnar body (fine particle copper paste 12c) having the shape of the opening portions 16a of the resist layer 16 is in close contact with the inner surface of the opening portions 16a, the fine copper particles contained in each columnar body coalesce together, and the volume is reduced as compared with the columnar body.

In FIG. 1(D), each columnar body (fine particle copper paste 12c) maintains firm contact with the inner surface of each opening portion 16a of the resist layer 16, and a portion in contact with the thin Cu film 17 at the bottom of the opening portion 16a is inhibited from shrinking in the direction parallel to the substrate plane before and after the sintering; thus, the planar shape of the sintered body does not change from the planar shape of the columnar body.

In FIG. 3(D), each columnar body (fine particle copper paste 12c) and the thin Cu film covering the side surface thereof maintain firm contact with the inner surface of each opening portion 16a of the resist layer 16, and shrinking is inhibited in the direction parallel to the substrate surface exposed at the opening portion 16a before and after the sintering; thus, the planar shape of the sintered body does not change from the planar shape of the columnar body.

In any embodiment, the conductive pillars obtained through the step of sintering the fine particle copper paste are excellent in dimensional stability. The sintered bodies 12 of the fine copper particles are formed directly on the first bonding layers 17c formed of the thin Cu films on the electrode pads 13. Thus, the first bonding layers 17c and the sintered bodies 12 can be firmly bonded to each other. In the conductive pillars 1, the first bonding layers 17c formed of the thin Cu film 17 and the sintered bodies 12 are firmly bonded to each other. This seems to contribute to an improvement in the strength of the conductive pillars 1. Each of the conductive pillars 1 includes the electrode pad 13 on the substrate 11, the thin Cu film (first bonding layer 17c) on the electrode pad 13, and the sintered body 12 on the first bonding layer 17c. The sintered body 12 has a porous structure and thus can be distinguished from the thin Cu film 17. In addition, the sintered body 12 has the porous structure and thus is considered to serve as a stress relaxation layer in the conductive pillar, thereby contributing to an improvement in bonding strength.

In the case where the step of exposing at least the exposed surfaces (upper surfaces in FIGS. 1(C) and 3(C)) of the columnar bodies to the oxygen-containing atmosphere having an oxygen concentration of 200 ppm or more is performed before the step of forming the sintered bodies 12, the multiple groove portions 12a extending from the upper surfaces 12b toward the substrate 11 are formed on the upper surfaces 12b of the sintered bodies 12 by sintering the columnar bodies, as illustrated in FIGS. 1(D) and 3(D). This is presumably because the fine copper particles contained in the fine particle copper paste 12c forming the surfaces of the columnar bodies to be the sintered bodies 12 are oxidized.

In a conventional technique, when a paste containing fine metal particles, such as fine copper particles, is applied to a substrate and sintered to form, for example, a line composed of a sintered body, a series of steps from the step of applying the paste containing fine metal particles to the substrate to the completion of sintering are conducted in an inert gas atmosphere. This is to prevent fine metal particles, such as fine copper particles, contained in the paste containing fine metal particles from being oxidized (see, for example, Japanese Patent Nos. 6168837 and 6316683). Accordingly, in the conventional technique, the atmosphere is not changed in the course of a series of steps from the step of applying the paste containing fine metal particles to the substrate to the completion of sintering. The paste containing fine metal particles applied to the substrate is not exposed to an atmosphere containing oxygen before sintering. No groove portion is formed on the upper surface of the sintered body.

If necessary, before the step of sintering the fine particle copper paste, a step of removing the fine particle copper paste 12c left on the upper portion of the resist layer or a step of removing the fine particle copper paste 12c left on the thin Cu film 17a on the upper portion of the resist layer may be additionally performed.

The step of removing the fine particle copper paste 12c may be conducted by wiping it off with a cloth. To remove all of the fine particle copper paste 12c from the upper portion of the resist layer, it is preferable to employ an etching method in which the paste is washed away with a cleaning solution.

Figure 2:
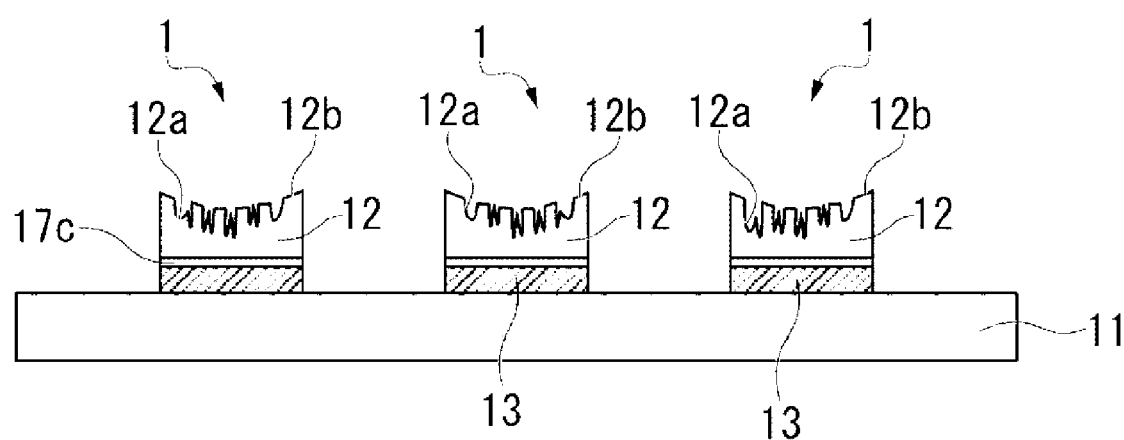
FIG. 2 is a cross-sectional view illustrating an example of a conductive pillar obtained by a method for manufacturing a conductive pillar of the present embodiment.

In the second embodiment, however, as will be described below, in the step of removing the residue of the fine particle copper paste left on the surface of the outermost layer over the substrate after the step of sintering the fine particle copper paste, the thin Cu film 17a on the upper portion of the resist layer illustrated in FIG. 3(D) can be simultaneously removed as illustrated in FIG. 2. Thus, it is possible to omit the step of removing the fine particle copper paste 12c left on the thin Cu film 17a left on the upper portion of the resist layer before the step of sintering the fine particle copper paste, thereby advantageously reducing the number of steps and the manufacturing cost.

In the present embodiment, if necessary, pre-baking for evaporating the solvent contained in the columnar bodies at a low temperature may be performed before firing the columnar bodies.

A firing method for firing the columnar bodies is not particularly limited. For example, a vacuum solder reflow device, a hot plate, or a hot air oven can be used.

The temperature and time for heating the substrate filled with the fine particle copper paste may be in a range such that the fine copper particles contained in the columnar bodies (fine particle copper paste 12c) coalesce together to form the sintered bodies 12 having sufficient conductivity and strength. The temperature for heating the substrate filled with the fine particle copper paste is preferably 150° C. to 350° C., more preferably 200° C. to 250° C. The heating time is preferably in the range of 1 to 60 minutes, more preferably in the range of 5 to 15 minutes.

The temperature at which the fine copper particles coalesce can be measured with a thermogravimetric analyzer (TG-DTA) or a differential scanning calorimeter (DSC).

The atmosphere at the time of sintering is not particularly limited. From the viewpoint of preventing oxidation of the copper particles, firing is preferably performed in an inert gas atmosphere, such as nitrogen or argon. A reducing gas may be used.

Through the steps described above, the conductive pillars 1 each including the electrode pad, the first bonding layer formed of the thin Cu film on the electrode pad, and the sintered body of the fine copper particles on the first bonding layer are obtained.

The conductive pillars 1 obtained by the method for manufacturing a conductive pillar according to the present embodiment will be described below.

(Conductive Pillar)

In the method for manufacturing the conductive pillar 1, the fine particle copper paste 12c having an average primary particle size of less than 1 μm is used in order to manufacture the sintered bodies 12 of the fine copper particles having an average particle size, measured by SAXS, of less than 1 μm. The fine particle copper paste 12c containing the fine copper particles having an average primary particle size of less than 1 μm has good filling properties when filled into the opening portions 16a. Thus, the conductive pillars 1 composed of the sintered bodies 12 formed by sintering the fine particle copper paste 12c (columnar bodies) filled in the opening portions 16a densely contain the fine copper particles and have good conductivity. In addition, the fine particle copper paste 12c has good filling properties; thus, it is possible to form the fine conductive pillars 1 that can cope with the miniaturization of the bonded structure. Moreover, since the fine particle copper paste 12c has good filling properties, the sintered bodies 12 formed by sintering the fine particle copper paste 12c (columnar bodies) have good bondability and electrical connection to the thin Cu film 17 (first bonding layers 17c) on the electrode pads 13 and to the second bonding layers described below.

When the conductive pillars 1 are formed of the sintered bodies 12 of fine copper particles having an average particle size, measured by SAXS, of 100 nm or less, the fine particle copper paste 12c containing fine copper particles having an average primary particle size of 100 nm or less is used. This fine particle copper paste 12c is more preferred because it has better filling properties when filled into the opening portions 16a.

Specifically, when the average primary particle size of the fine copper particles contained in the fine particle copper paste 12c is 100 nm or less, the conductive paste 12c can be densely filled into the opening portions 16a even if the opening portions 16a have a fine cylindrical shape with a diameter of 100 μm, for example.

The average particle size in the conductive pillars 1 measured by SAXS is preferably less than 1 μm, more preferably 500 nm or less, even more preferably 100 nm or less. The average particle size of the conductive pillars 1 measured by SAXS is preferably 10 nm or more and less than 1 μm, more preferably 20 nm or more and 500 nm or less, even more preferably 30 nm or more and 100 nm or less.

In contrast, for example, when a fine particle copper paste having an average primary particle size of 1 μm or more is used in order to manufacture sintered bodies of fine copper particles having an average particle size, measured by SAXS, of 1 μm or more, the fine particle copper paste has insufficient filling properties when filled into the opening portions. Thus, it is difficult to manufacture fine conductive pillars, making it difficult to deal with miniaturization of the bonded structure.

In the method for manufacturing the conductive pillar 1, since the average primary particle size of the fine copper particles contained in the fine particle copper paste 12c is less than 1 μm, the shape of the conductive pillars 1 can be formed by the coalescence function of the fine copper particles obtained by sintering the fine particle copper paste 12c (columnar bodies).

In the method for manufacturing a conductive pillar, the sintered bodies 12 to be the conductive pillars 1 are provided on the electrode pads 13 on the substrate 11 including the electrode pads 13 via the thin Cu film (that is, the first bonding layers 17c) (see FIGS. 1(D) and 3(D)). The electrode pads 13 are often composed of aluminum. When an oxide film is formed on the surface of each electrode pad 13 composed of aluminum, the bonding strength (shear strength) between the electrode pad 13 and the sintered body 12 may be impaired. However, in the method for manufacturing the conductive pillar 1 of the present embodiment, since the thin Cu film (that is, the first bonding layers 17c) is formed on the surfaces of the electrode pads 13, it is possible to prevent the formation of an oxide film on the surface of each electrode pad 13. Thus, each of the electrode pads 13 composed of aluminum and a corresponding one of the conductive pillars 1 composed of the sintered bodies 12 can be bonded to each other with high bonding strength (shear strength).

Each of the opening portions 16a has a substantially cylindrical shape; thus, each of the sintered bodies 12 has a substantially cylindrical outer shape. When each sintered body 12 has a substantially cylindrical outer shape, the bondability with the second bonding layer described below is improved, and the substrate 11 and a bonding member to be bonded to the substrate 11 are bonded with higher bonding strength, which is preferred.

The size of the substantially cylindrical sintered body 12 is preferably 200 μm or less in diameter, more preferably 100 μm or less, particularly preferably 50 μm or less in order to cope with the miniaturization of the bonded structure due to the miniaturization of electronic devices. The size of the sintered body 12 is preferably 5 μm or more in diameter, more preferably 10 μm or more, even more preferably 20 μm or more in order to further improve the bondability with the second bonding layer described below and the conductivity. The upper and lower surfaces of the substantially cylindrical sintered body 12 preferably have a diameter of 5 to 200 μm, more preferably 10 to 100 μm, even more preferably 20 to 50 μm.

The planar shape of the sintered body 12 is not limited to a substantially circular shape and can be appropriately determined in accordance with, for example, the planar shape of the electrode pad 13. For example, the planar shape of the sintered body 12 may be a polygonal shape, such as a substantially rectangular shape, a substantially elliptical shape, or a substantially oval shape.

The upper surface 12b of each sintered body 12 has a concave shape recessed toward the substrate 11 (see FIGS. 1(D) and 3(D)). The concave shape preferably has a substantially hemispherical shape. In this case, the contact area between the upper surface 12b of the sintered body 12 and the second bonding layer described below is large, breakage is less likely to occur at the interface with the second bonding layer when shear stress is applied from the side surface of the conductive pillar, and the bondability between the sintered body 12 and the second bonding layer is further improved. Thereby, the substrate 11 and the bonding member are bonded with higher bonding strength, which is preferred.

The upper surface 12b of each sintered body 12 preferably has multiple groove portions 12a extending from the upper surface 12b toward the substrate 11 (see FIGS. 1(D) and 3(D)). In the case where the sintered body 12 has the multiple groove portions 12a, a material to be a bonding layer described below is melted to enter the groove portions 12a and then solidified to form anchor portions. Thereby, the bondability between the sintered body 12 and the bonding layer is further improved, and the substrate 11 and the bonding member to be bonded to the substrate 11 are bonded with higher bonding strength, which is preferred.

Each sintered body 12 is composed of the sintered body of fine copper particles having an average particle size of less than 1 μm and has a porous structure in which the fine copper particles coalesce through sintering.

As the average particle size of the fine copper particles forming the sintered body 12, a measurement value measured by small-angle X-ray scattering (SAXS) is used.

Each conductive pillar 1 is composed of the sintered body 12 of fine copper particles having an average particle size of less than 1 µm; thus, the conductive pillar 1 densely contains the fine copper particles and has good conductivity. In the case where the conductive pillar 1 is formed of the sintered body 12 of fine copper particles having an average particle size of less than 1 µm, for example, even when the sintered body 12 has a substantially cylindrical shape and has a small diameter of 100 µm or less, which can cope with miniaturization of the bonded structure, the conductive pillar 1 has sufficient conductivity because it densely contains a sufficient number of fine copper particles. Accordingly, the conductive pillar 1 of the present embodiment can cope with miniaturization of the bonded structure.

Since the conductive pillar 1 is formed of the sintered body 12 of the fine copper particles having an average particle size of less than 1 µm, the surface area of the fine copper particles exposed at the surface of the sintered body 12 is larger than that in the case where the conductive pillar 1 is formed of a sintered body of fine copper particles having an average particle size of 1 µm or more. This improves the bondability and electrical connection between the sintered body 12 and the electrode pad 13 and between the sintered body 12 and the second bonding layer described below.

Since the conductive pillar 1 is formed of the sintered body 12 of fine copper particles having an average particle size of less than 1 µm, the shape of the conductive pillar 1 can be formed by the coalescence function of the fine copper particles obtained by sintering.

In contrast, when the average particle size of the fine copper particles is 1 µm or more, it is difficult to form the shape of the conductive pillar using the function of allowing the fine copper particles to coalesce together by sintering. Thus, when the average particle diameter of the fine copper particles is 1 µm or more, the conductive pillar needs to contain a binder resin for bonding the fine copper particles to each other. For this reason, when the average particle size of the fine copper particles is 1 µm or more, the heat resistance performance is inferior to that of the conductive pillar 1 of the present embodiment.

The conductive pillar 1 is more preferably formed of the sintered body 12 of fine copper particles having an average particle size, measured by SAXS, of 100 nm or less. When the average particle size of the fine copper particles is 100 nm or less, the conductive pillar 1 is formed of the sintered body 12 more densely containing the fine copper particles and having a larger surface area of the fine copper particles exposed at the surfaces, which is preferred.

The metal species used as the fine copper particles may be only a single type of Cu, a mixture of one or more metal elements other than Cu, or an alloy containing one or more metal elements other than Cu.

The method for manufacturing the conductive pillar 1 of the present embodiment includes a step of forming a cylindrical body on the substrate 11 using fine copper particles having an average primary particle size of less than 1 µm, and a step of sintering the cylindrical body to form the sintered body 12 having the upper surface 12b with a concave shape recessed toward the substrate 11. Thus, according to the method for manufacturing the conductive pillar 1 of the present embodiment, the conductive pillar 1 can be manufactured without employing an electroplating method.

In contrast, for example, in the case where the copper pillar is formed on the substrate by an electroplating method, when an underlying plating layer disposed under the resist layer is removed by etching after the formation of the copper pillar, the substrate is partially removed along with the underlying plating layer, in some cases. In addition, in the case of forming the copper pillar by an electroplating method, the cost for introducing facilities necessary for forming the copper pillar is high, and the environmental load due to the harmful waste liquid is also large.

<Step of Removing Residue>

Figure 6A:
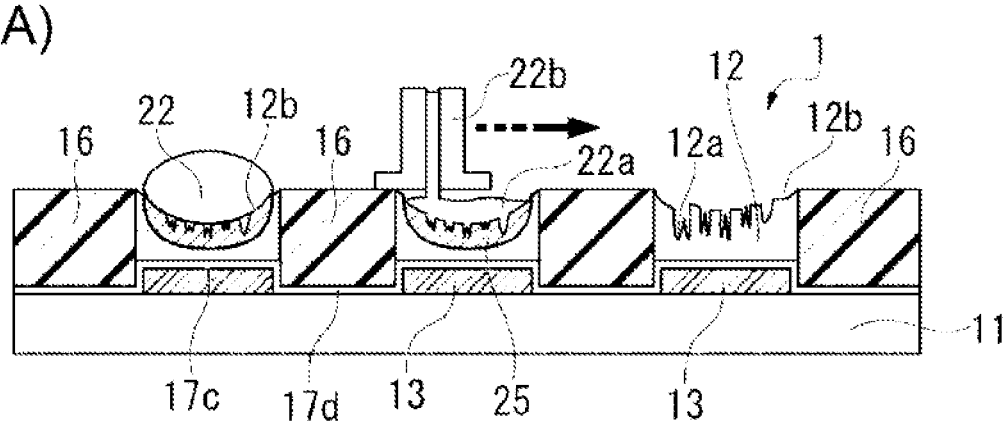
FIGS. 6(A) to 6(C) are process diagrams illustrating an example of a method for manufacturing a bonded structure of the present embodiment.
Figure 8A:
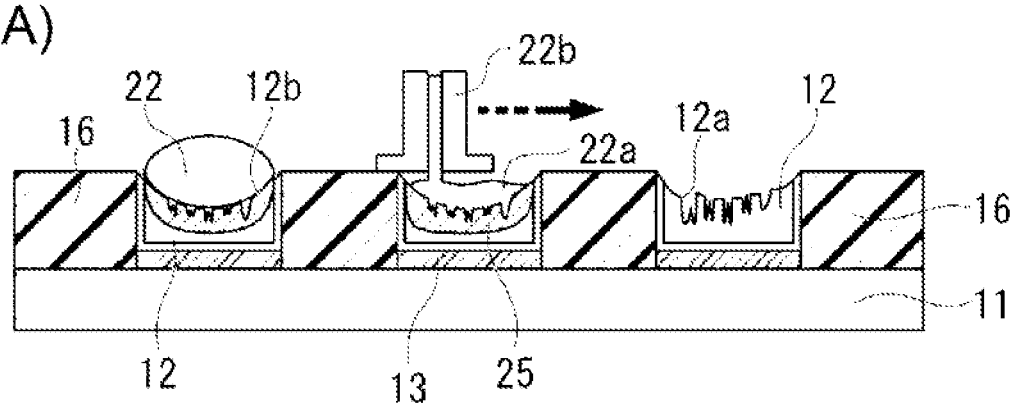
FIGS. 8(A) to 8(C) are process diagrams illustrating an example of a method for manufacturing a bonded structure of the present embodiment.

After the step of sintering the fine particle copper paste, it is preferable to further include a step of removing the residue of the fine particle copper paste left on the surface of the outermost layer over the substrate. In the step of sintering the fine particle copper paste, the residue of the fine particle copper paste is left on the surface of the resist layer, in some cases. When a material 22a to be formed into second bonding layers 22 described below is supplied, as it is, to the concave shape, recessed toward the substrate 11, of the sintered bodies 12 illustrated in FIG. 1(D) or FIG. 3(D), the entire area including the upper portion of the resist layer 16 is covered with the material 22a to be formed into the second bonding layers 22 because of a small surface energy difference between the upper portion of the resist layer 16 and the material 22a to be formed into the second bonding layers 22, thereby making it difficult to form the second bonding layers 22 into a protruding shape, as illustrated in FIGS. 6(A) to 6(C) or 8(A). After the step of sintering the fine particle copper paste, a step of removing the residue of the fine particle copper paste left on the surface of the resist layer is further provided. This results in the fact that the second bonding layers 22 have a convexly protruding shape as illustrated in FIG. 6(A) or 8(A) because of the large surface energy difference between the resist layer 16 and the material 22a to be formed into the second bonding layers 22.

As the method for removing the residue of the fine particle copper paste left on the surface of the resist layer, for example, a physical method, such as chemical mechanical polishing (CMP), or a chemical method, such as wet etching in which a component soluble in a liquid is dissolved, or dry etching in which a material is etched with a reactive gas (etching gas), ions, or radicals, can be used. Among these, wet etching is preferred in which a component soluble in an acid or an alkali is dissolved by being brought into contact with the acid or the alkali. A known and commonly used substance can be used as a copper etching solution. Examples of the etching solution that can be used include an etching solution containing hydrogen peroxide, sulfuric acid, azole, and bromide ions (Japanese Unexamined Patent Application Publication No. 2006-13340), an etching agent characterized by containing sulfuric acid, hydrogen peroxide, and a benzotriazole derivative (Japanese Unexamined Patent Application Publication No. 2009-149971), an etching solution characterized by containing hydrogen peroxide and sulfuric acid as main components and azole as an additive (Japanese Unexamined Patent Application Publication No. 2006-9122), an etching solution containing hydrogen peroxide, sulfuric acid, aminotetrazole, and phenylurea (Japanese Unexamined Patent Application Publication No. 2000-297387), an etching solution containing hydrogen peroxide, mineral acid, azole, silver ions, and a halogen (Japanese Unexamined Patent Application Publication No. 2003-3283), an etching solution containing hydrogen peroxide, sulfuric acid, benzotriazole, and chloride ions (Japanese Unexamined Patent Application Publication No. 2005-213526)), and an etching solution containing hydrogen peroxide, sulfuric acid, phenylurea, halide ions, and tetrazole (Japanese Unexamined Patent Application Publication No. 2015-120970).

Figure 4:
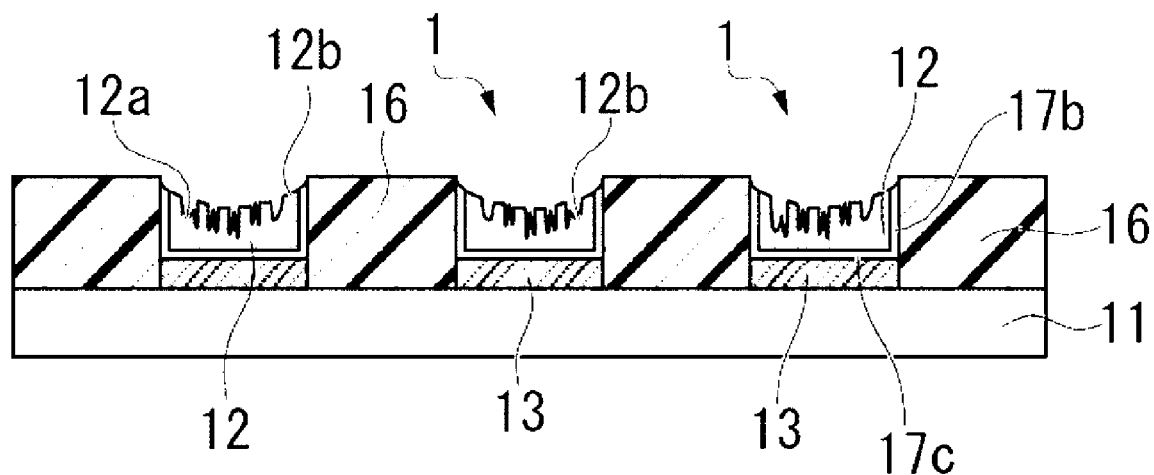
FIG. 4 is a cross-sectional view illustrating an example of a conductive pillar obtained by a method for manufacturing a conductive pillar of the present embodiment.

In the second embodiment, the step of removing the residue of the fine particle copper paste left on the outermost layer over the substrate has the advantage that the paste and the thin Cu film 17a on the upper portion of the resist layer illustrated in FIG. 3(D) can be simultaneously removed, as illustrated in FIG. 4. Even after the removal of the residue of the fine particle copper paste, the thin Cu films 17b on the side surfaces of the sintered bodies and the thin Cu films 17c on the electrode pads remain because they are buried by the resist layer 16.

For example, as described in the first embodiment, when thin Cu films 17d are formed under the resist layer, the thin Cu films 17d cannot be simultaneously removed in the step of removing the residue of the fine particle copper paste left on the surface of the outermost layer over the substrate. Thus, both the step of removing the fine particle copper paste 12c left on the resist layer and the step of removing the thin Cu film 17d under the resist layer are required.

However, in the method according to the second embodiment for manufacturing the conductive pillar 1 including the thin Cu film 17a on the upper portion of the resist layer, the thin Cu film 17a on the upper surface of the resist layer can be simultaneously removed in the step of removing the residue of the fine particle copper paste left on the outermost layer including the surface of the resist layer on the substrate after the step of sintering the fine particle copper paste. Thus, the step of removing the fine particle copper paste 12c left on the upper portion of the resist layer before the step of sintering the fine particle copper paste can be advantageously omitted.

<Step of Removing Resist Layer and Exposed Thin Cu Film>

The method for manufacturing a conductive pillar according to the first embodiment can further include, after the step of sintering the fine particle copper paste, the step of removing the resist layer and then removing the exposed thin Cu film as illustrated in FIG. 2.

First, the resist layer 16, illustrated in FIG. 1(D), provided on the substrate 11 via the thin Cu films 17d under the resist layer 16 is removed to expose the thin Cu films 17d under the resist layer 16. As a method for removing the resist layer 16, a known method can be used.

Next, the exposed thin Cu films 17d are removed to expose the substrate 11 as illustrated in FIGS. 3(A) to 3(D). An example of a method for removing the exposed thin Cu films 17d is the same method as described as the method for removing the residue of the fine particle copper paste.

Thereby, the conductive pillars 1 composed of the sintered bodies 12 of the fine copper particles are obtained on the electrode pads 13 on the substrate 11 via the first bonding layers 17c composed of the thin Cu films 17. The upper surface of each sintered body 12 has a concave shape recessed toward the substrate 11.

In the case where an underlying copper plating layer is formed under a resist layer and where copper pillars are formed by an electroplating method in the related art, it is necessary to apply a potential to the underlying copper plating layer under the resist layer to allow a uniform current to flow, and thus the underlying copper plating layer needs to be thick. In addition, the underlying copper plating layer and the copper pillars are composed of the same copper. Thus, when the underlying copper plating layer under the resist layer is etched, the copper pillars may also be etched and thinned.

In the first embodiment, unlike the case where copper pillars are formed by an electroplating method, a potential need not be applied to the underlying plating layer under the resist layer, and it is not necessary to allow a uniform current to flow, so that the thin Cu film under the resist layer can have a smaller thickness. The thin Cu film and the conductive pillars are composed of the same copper; thus, the conductive pillars may be thinned by etching. However, in the present embodiment, since the thin Cu film under the resist layer can be have a smaller thickness, the conductive pillars are less likely to be thinned by etching when the thin Cu film is removed. In addition, the thin Cu film and the conductive pillars are etched in the same manner, so that no undercut is formed.

In the case where a thin Ti film is formed under the underlying copper plating layer, the thin Ti film under the copper pillars is also etched when the exposed thin Ti film is etched after the resist layer is removed, thereby forming undercuts.

In the first embodiment, even when the thin Ti film is formed under the thin Cu film, the thin Cu film and the thin Ti film can be made thinner than in the conventional case where an underlying copper plating layer is formed under a resist layer and copper pillars are formed by an electroplating method; thus, undercuts are less likely to be formed around the bottoms of the conductive pillars.

In each of the conductive pillars 1 obtained here, the sintered body 12 of the fine copper particles is directly formed on the first bonding layer 17c composed of the thin Cu film on the electrode pad 13, so that the first bonding layer 17c and the sintered body 12 can be strongly bonded. In addition, undercuts are less likely to be formed around the bottoms of the conductive pillars 1; thus, the conductive pillars having a fine shape can be stably formed. Moreover, the substrate 11 and a bonding member should be bonded with high bonding strength via the second bonding layers 22.

<Step of Removing Resist Layer>

Figure 5:
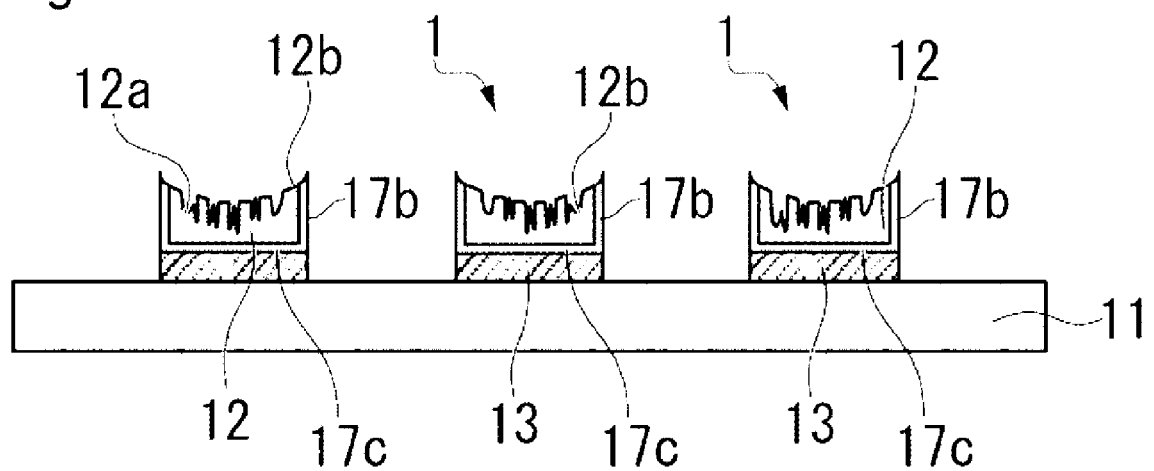
FIG. 5 is a cross-sectional view illustrating an example of a conductive pillar obtained by a method for manufacturing a conductive pillar of the present embodiment.

As illustrated in FIG. 5, the method for manufacturing a conductive pillar according to the second embodiment can further include a step of removing the resist layer after the step of sintering the fine particle copper paste. In the second embodiment, the resist layer 16 provided directly on the substrate 11 illustrated in FIG. 4. 0 cm is removed to expose the substrate 11 as illustrated in FIG. 5. This results in the conductive pillars 1 composed of the sintered bodies 12 of the fine metal particles provided on the substrate 11 via the electrode pads 13, the upper surface of each sintered body 12 having a concave shape recessed toward the substrate 11, the side surface of the sintered body 12 being covered with the thin Cu film 17b.

Unlike the case of forming copper pillars by an electroplating method, the underlying plating layer is not located under the resist layer; thus, there is no need to etch away the underlying plating layer in the step of removing the resist layer in the present embodiment, and there is no possibility that undercuts are formed at the bottoms of the conductive pillars 1. In addition, the resist layer 16 can be removed while leaving the thin Cu films 17b on the side surfaces of the sintered bodies.

Although the case of removing the resist layer 16 illustrated in FIG. 5 has been described as an example, the resist layer 16 may be removed directly from the state where the thin Cu film 17 is formed on the surface of the resist layer 16 illustrated in FIG. 3(D). As a method for removing the resist layer 16, a known method can be used.

Each of the conductive pillars 1 obtained here has no undercuts, and the side surface of the sintered body 12 is covered with the thin Cu film 17b; thus, the substrate 11 and a bonding member can be bonded with high bonding strength via the bonding layer. In addition, it should be possible to form the conductive pillars of fine shape with good stability.

<<Method for Manufacturing Bonded Structure>>

Figure 6B:
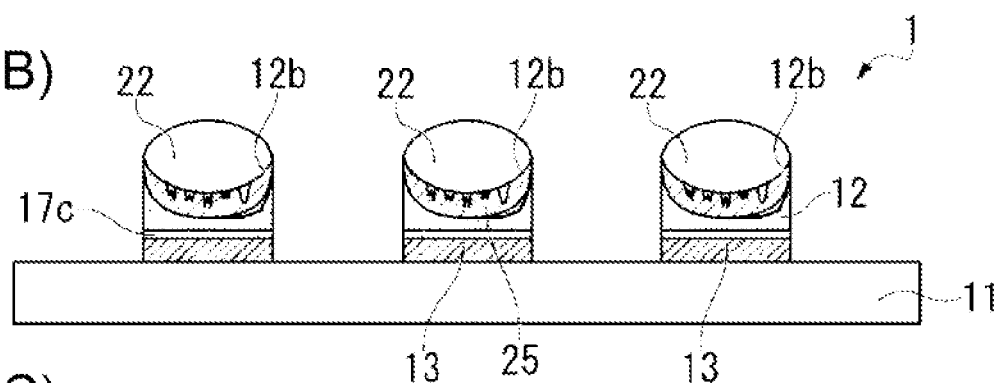
Figure 6C:
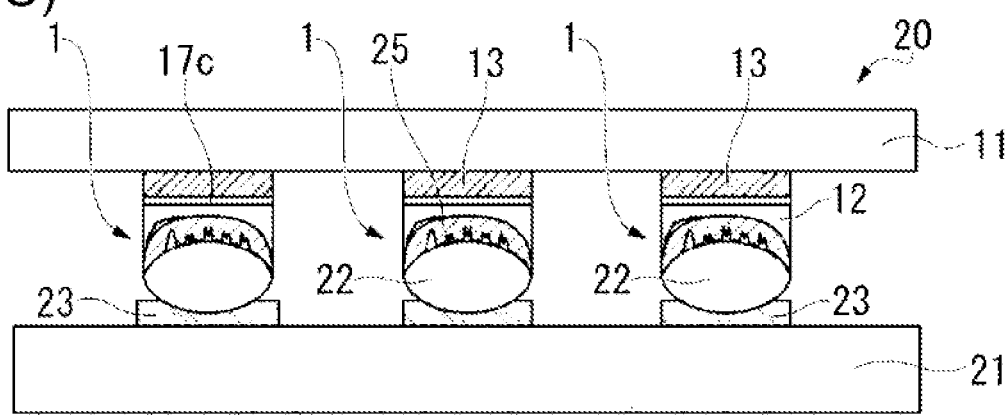
Figure 8B:
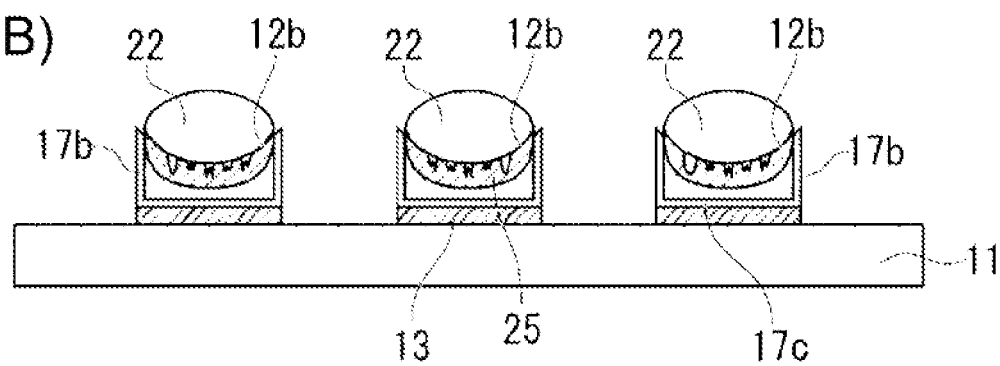
Figure 8C:
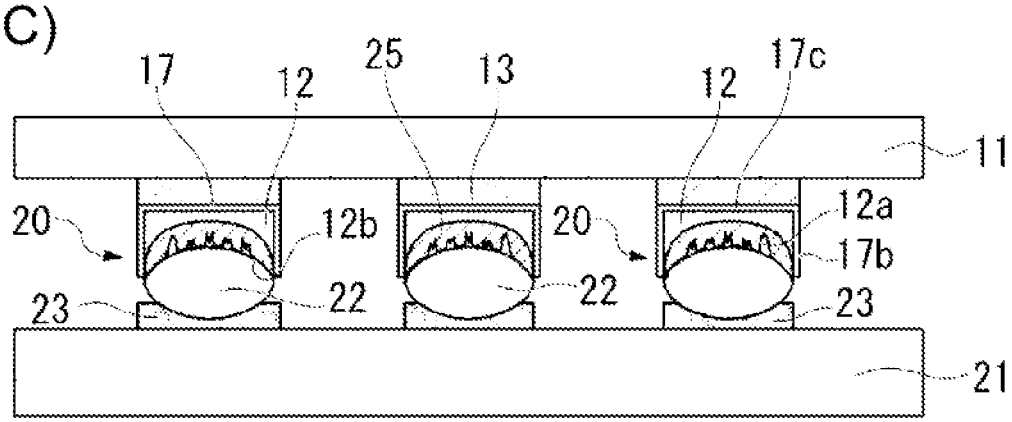

FIGS. 6(A) to 6(C) and FIGS. 8(A) to 8(C) are process diagrams illustrating an example of a method for manufacturing a bonded structure. The method for manufacturing a bonded structure described in FIGS. 6(C) and 8(C) will be described in detail below. For convenience of explanation, a method for manufacturing a bonded structure illustrated in FIGS. 6(A) to 6(C) is described as a third embodiment, and a method for manufacturing a bonded structure illustrated in FIGS. 8(A) to 8(C) is described as a fourth embodiment.

Third Embodiment

As a method for manufacturing a bonded structure of the present embodiment, a case where the bonded structure is manufactured using the conductive pillars 1 illustrated in FIG. 1(D) will be described in detail as an example.

FIGS. 6(A) to 6(C) are process diagrams illustrating an example of a method for manufacturing a bonded structure of the third embodiment.

To manufacture a bonded structure 20 illustrated in FIG. 6(C), the material 22a to be formed into second bonding layers 22 is supplied to the upper concave portions, recessed toward the substrate 11, of the sintered bodies 12 illustrated in FIG. 1(D), is melted (reflowed), and solidified, as illustrated in FIG. 6(A). This results in bumps formed of the second bonding layers 22 along the concave shape of the sintered bodies 12. As illustrated in FIG. 6(A), the resulting second bonding layers 22 have a convexly protruding shape due to a large surface energy difference between the resist layer 16 and the material 22a to be formed into the second bonding layers 22.

As illustrated in FIG. 6(A), the multiple groove portions 12a extending from the upper surface 12b toward the substrate 11 are formed on the upper surface 12b of each sintered body 12. By melting (reflowing) the material 22a to be formed into the second bonding layers 22, the material 22a to be formed into the second bonding layers 22 enters the groove portions 12a, so that the groove portions 12a are filled therewith, thereby forming anchor portions. The molten material 22a to be formed into the second bonding layers 22 also enters the porous structure of the sintered body 12 and is solidified.

The material 22a to be formed into the second bonding layers 22 supplied to the concave shape of the sintered bodies 12 forms intermetallic compound layers 25 with the fine copper particles in the sintered bodies 12. The sintered body 12 has a porous structure and thus a large specific surface area. Thus, in the present embodiment, for example, the intermetallic compound layers 25 are formed more quickly than in the case where the conductive pillars are composed of a dense bulk metal formed by, for example, an electroplating method.

Fourth Embodiment

As a method for manufacturing a bonded structure of the present embodiment, a case where the bonded structure is manufactured using the conductive pillars 1 illustrated in FIG. 4 will be described in detail as an example.

FIGS. 8(A) to 8(C) are process diagrams illustrating an example of a method for manufacturing a bonded structure of the present embodiment.

To manufacture the bonded structure 20 illustrated in FIG. 8(C), the material 22a to be formed into bonding layers 22 is supplied to the concave shape, recessed toward the substrate 11, of the sintered bodies 12 illustrated in FIG. 4, is melted (reflowed), and solidified, as illustrated in FIG. 8(A). This results in bumps formed of the bonding layers 22 along the concave shape of the sintered bodies 12. As illustrated in FIG. 8(A), the resulting bonding layers 22 have a convexly protruding shape due to a large surface energy difference between the resist layer 16 and the material 22a to be formed into the bonding layers 22.

As illustrated in FIG. 8(A), the multiple groove portions 12a extending from the upper surface 12b toward the substrate 11 are formed on the upper surface 12b of each sintered body 12. By melting (reflowing) the material 22a to be formed into the bonding layers 22, the material 22a to be formed into the bonding layers 22 enters the groove portions 12a, so that the groove portions 12a are filled therewith, thereby forming anchor portions. The molten material 22a to be formed into the bonding layers 22 also enters the porous structure of the sintered body 12 and is solidified.

The material 22a to be formed into the bonding layers 22 supplied to the concave shape of the sintered bodies 12 forms intermetallic compound layers 25 with the fine copper particles in the sintered bodies 12. The sintered body 12 has a porous structure and thus a large specific surface area. Thus, in the present embodiment, for example, the intermetallic compound layers 25 are formed more quickly than in the case where the conductive pillars are composed of a dense bulk metal formed by, for example, an electroplating method.

As a method for supplying the material 22a, to be formed into the second bonding layer 22, to the concave shape of the sintered bodies 12, for example, a printing method, such as a stencil mask method or a dry film method, a ball mount method, a vapor deposition method, or an injection molded solder method (IMS method) can be used. Among these, it is particularly preferable to employ the IMS method in which the molten solder is embedded in the concave shape of the sintered bodies 12 using an injection head 22b as illustrated in FIGS. 6(A) and 8(A). By employing the IMS method, solder, serving as the material 22a to be formed into the second bonding layers 22, can be supplied in a molten state to the concave shape of the sintered bodies 12, which is preferred.

<Step of Removing Resist Layer and Exposed Thin Cu Film>

As illustrated in FIG. 6(B), in the third embodiment, steps of removing the resist layer 16 and the exposed thin Cu films 17d under the resist layer 16 can be included.

First, the resist layer 16, illustrated in FIG. 6(A), provided on the substrate 11 via the thin Cu films 17d under the resist layer 16 is removed to expose the thin Cu films 17d under the resist layer 16. As a method for removing the resist layer 16, a known method can be used.

Next, the exposed thin Cu films 17d are removed to expose the substrate 11 as illustrated in FIG. 6(B). An example of a method for removing the exposed thin Cu films 17d is the same method as described as the method for removing the residue of the fine particle copper paste.

Thereby, the conductive pillars 1 composed of the sintered bodies 12 of the fine copper particles are obtained on the electrode pads 13 on the substrate 11 via the first bonding layers 17c composed of the thin Cu films 17. In each of the conductive pillars 1 obtained here, the upper surface of the sintered body 12 has a concave shape recessed toward the substrate 11, and a bump formed of the second bonding layer 22 along the concave shape of the sintered body 12 is provided.

As described above, in the third embodiment, unlike the case where copper pillars are formed by an electroplating method, a potential need not be applied to the underlying plating layer under the resist layer, and it is not necessary to allow a uniform current to flow, so that the thin Cu film under the resist layer can have a smaller thickness. In the third embodiment, the conductive pillars are less likely to be thinned by etching when removing the exposed thin Cu film from under the resist layer, and undercuts are less likely to be formed around the bottoms of the conductive pillars 1.

In the conductive pillars 1 obtained here, undercuts are less likely to be formed; thus, the conductive pillars having a fine shape can be stably formed. Moreover, the substrate 11 and a bonding member should be bonded with high bonding strength via the second bonding layers 22.

<Step of Removing Resist Layer>

As illustrated in FIG. 8(B), in the fourth embodiment, the resist layer 16 is removed. As a method for removing the resist layer 16, a known method can be used.

The resist layer 16 provided directly on the substrate 11 illustrated in FIG. 8(A) is removed to expose the substrate 11 as illustrated in FIG. 8(B). This results in the conductive pillars 1 composed of the sintered bodies 12 of the fine metal particles provided on the substrate 11 via the electrode pads 13. In each of the conductive pillars obtained here, the upper surface of the sintered body 12 has a concave shape recessed toward the substrate 11, a bump formed of the bonding layer 22 along the concave shape of the sintered body 12 is provided, and the side surface of the sintered body 12 is covered with the thin Cu film 17b.

Also in the step of removing the resist layer, when the resist layer 16 is removed, since an underlying plating layer is not disposed under the resist layer unlike the case of forming the copper pillar by an electroplating method, multi-stage etching is not required, and the resist layer 16 can be removed by a single step, so that there is no possibility of the formation of undercuts between the electrode pads 13 and the sintered bodies 12, and fine copper pillars having a good cylindrical shape can be formed. The resist layer 16 can be removed while leaving the thin Cu films 17b on the side surfaces of the sintered bodies. In addition, since there is no possibility of formation of an undercut, the method for manufacturing a conductive pillar according to the second embodiment has the advantage that conductive pillars 1a, 1b, and 1c having different planar shape sizes can be formed in one operation or multiple conductive pillars having different planar shapes can be formed in one operation, as illustrated in FIG. 9(B) described below.

The conductive pillars obtained here has no undercut, and the side surface of the sintered body 12 is covered with the thin Cu film 17b; thus, the conductive pillars having a fine shape can be stably formed. Moreover, the substrate 11 and a bonding member should be bonded with high bonding strength via the bonding layers 22.

In FIGS. 8(A) to 8(C), the case where the resist layer 16 is removed after the formation of the bonding layers 22 has been described as an example, the resist layer 16 need not be removed after the formation of the bonding layers 22. When the resist layer 16 is not removed, the resist layer 16 is disposed between the substrate 11 and a bonding member described below by stacking the substrate 11 and the bonding member.

<Step of Bonding Substrate and Bonding Member>

The substrate 11 and a bonding member 21 are electrically connected by a flip-chip mounting method. Specifically, as illustrated in each of FIGS. 6(C) and 8(C), the substrate 11 on which the second bonding layers 22 are formed on the sintered bodies 12 and the bonding member 21 are stacked so as to face each other. In the fourth embodiment, the surface of the bonding member 21 on which electrodes 23 are arranged is disposed facing upward, and the surface of the substrate 11 on which the second bonding layers 22 are arranged is disposed facing downward. The electrodes 23 on the bonding member 21 and the second bonding layers 22 on the substrate 11 are stacked. Thereafter, the second bonding layers 22 are melted by heating while the substrate 11 and the bonding member 21 are stacked, so that the substrate 11 and the bonding member 21 are bonded, and the second bonding layers 22 are then solidified.

Through the above steps, the bonded structure 20 is obtained.

Each of the conductive pillars 1 is composed of the sintered body 12 of the fine copper particles on the electrode pad 13 on the substrate 11 via the first bonding layer 17c composed of the thin Cu film 17. Since the sintered body 12 of the fine copper particles is formed directly on the first bonding layer 17c composed of the thin Cu film on the electrode pad 13, the first bonding layer 17c and the sintered body 12 can be firmly bonded to each other. The fine copper particles in the sintered body 12 has an average particle size, measured by SAXS, of less than 1 μm, and the upper surface 12b (lower surface in FIGS. 6(C) and 8 (C)) of the sintered body 12 has a concave shape recessed toward the substrate 11. Thus, by providing the second bonding layer 22 along the concave shape of the conductive pillar 1, the second bonding layer 22 entering the concave shape of the conductive pillar 1 is formed. In addition, in the conductive pillar 1, the sintered body 12 of the fine copper particles has an average particle size, measured by SAXS, of less than 1 μm and has a porous structure in which the fine copper particles have coalesced through sintering. For this reason, when the second bonding layer 22 is formed, the molten material 22a to be formed into the second bonding layer 22 enters the porous structure of the sintered body 12 and is solidified. Accordingly, the conductive pillar 1 of the first embodiment has a large bonding area with the second bonding layer 22; thus, the conductive pillar 1 is bonded to the second bonding layer 22 with high bonding strength (shear strength) as compared with, for example, a conductive pillar that has an upper flat surface parallel to the substrate and that is composed of a dense metal formed by an electroplating method. As a result, according to the conductive pillar 1 of the first embodiment, it is possible to bond the substrate 11 and the bonding member 21 via the second bonding layer 22 with high bonding strength (shear strength).

In addition, the conductive pillar 1 is composed of the sintered body 12 of the fine copper particles having an average particle size of less than 1 μm and has a porous structure in which the fine copper particles have coalesced through sintering; thus, the stress due to a difference in thermal expansion coefficient can be relieved to result in excellent durability, compared with a dense bulk metal formed by, for example, an electroplating method.

The bonded structure 20 is disposed between the substrate 11 and the bonding member 21 and includes the conductive pillar 1 and the second bonding layer 22 provided along the concave shape of the conductive pillar 1. Accordingly, in the bonded structure 20 of the first embodiment, the second bonding layer 22 enters the concave shape of the conductive pillar 1, and the substrate 11 and the bonding member 21 are bonded with high bonding strength via the second bonding layer 22.

As the material of the second bonding layer 22, for example, Au, Ag, Cu, Sn, Ni, or a solder alloy can be used. An alloy containing one or more metals selected from Sn, Pb, Ag, and Cu is preferably used. The second bonding layer 22 may be composed of only a single component or may contain multiple components.

As the solder alloy used as the material of the second bonding layer 22, for example, a Sn—Ag alloy, a Sn—Pb alloy, a Sn—Bi alloy, a Sn—Zn alloy, a Sn—Sb alloy, a Sn—Bi alloy, a Sn—In alloy, a Sn—Cu alloy, or an alloy in which two elements selected from the group consisting of Au, Ag, Bi, In, and Cu are added to Sn, can be used.

[Bonded Structure]

FIGS. 6(C) and 8 (C) are each a cross-sectional view illustrating an example of a bonded structure obtained by a method for manufacturing a bonded structure. Each of the bonded structures 20 illustrated in FIGS. 6(C) and 8(C) includes the substrate 11, the conductive pillar 1, the second bonding layer 22 provided along the concave shape of the conductive pillar 1, and the bonding member 21. The sintered body 12 of the fine copper particles is formed directly on the first bonding layer 17c composed of the thin Cu film on the electrode pad 13; thus, the first bonding layer 17c and the sintered body 12 can be firmly bonded to each other. In the conductive pillar 1, the first bonding layer 17c formed of the thin Cu film 17 and the sintered body 12 are firmly bonded to each other. This seems to contribute to an improvement in the strength of the conductive pillar 1 and the bonded structure 20. In each of the bonded structures 20 illustrated in FIGS. 6(C) and 8(C), the multiple groove portions 12a extending from the upper surface 12b of the conductive pillar 1 (lower surface in FIGS. 6(C) and 8(C)) toward the substrate 11 are filled with part of the second bonding layer 22, resulting in the anchor portions. Thus, in the bonded structure 20 illustrated in each of FIGS. 6(C) and 8(C), the sintered body 12 of the conductive pillar 1 and the second bonding layer 22 are bonded to each other with higher bonding strength (shear strength).

Each of the bonded structures 20 illustrated in FIGS. 6(C) and 8(C) contains the intermetallic compound layer 25 at the interface between the conductive pillar 1 and the second bonding layer 22. The intermetallic compound layer 25 improves the bonding strength (share strength) between the conductive pillar 1 and the second bonding layer 22. The intermetallic compound layer 25 is formed by the diffusion of a component in the second bonding layer 22 toward the inside of the conductive pillar 1 and a fine particle copper component in the sintered body 12 toward the inside of the second bonding layer 22. Accordingly, the composition of the intermetallic compound layer 25 varies in accordance with the metal species forming the sintered body 12 and the second bonding layer 22 and the sintering conditions.

As illustrated in FIGS. 6(C) and 8(C), in each bonded structure 20, the substrate 11 and the bonding member 21 are arranged so as to face each other. The bonding member 21 is not particularly limited as long as it is a substrate including a freely-selected electric circuit and the electrode 23 provided on a surface thereof. For example, as the bonding member 21, a glass substrate, a ceramic substrate, a Si substrate, such as a Si interposer, a resin substrate, or a printed circuit board can be used. When the bonded structure 20 having the fine conductive pillar 1 is manufactured, a glass substrate, a ceramic substrate, and a Si substrate, which have excellent dimensional stability, can be preferably selected.

FIGS. 7(A), 7(B), 9(A) and 9(B) each illustrate three bonded structures 20 in which the substrate 11 and the bonding member 21 are disposed to face each other. The number of the bonded structures 20 in which the substrate 11 and the bonding member 21 are disposed to face each other is not limited to three, but may be one, two, or four or more, and is determined as needed.

The bonded structure 20 includes the conductive pillar 1 of the present embodiment and the second bonding layer 22 provided along the concave shape of the conductive pillar 1. In the bonded structure 20 illustrated in FIGS. 7(A) and 7(B), the conductive pillar 1 illustrated in FIG. 1(D) is provided in a state where the vertical direction in FIG. 1(D) is inverted. In the bonded structure 20 illustrated in FIGS. 9(A) and 9(B), the conductive pillar 1 illustrated in FIG. 3(D) is provided in a state where the vertical direction in FIG. 3(D) is inverted.

The case where the second bonding layer 22 has a single-layer structure composed of a single material will be described as an example. However, the second bonding layer may have a multilayer structure in which two or more materials are stacked.

Other Examples

Figure 7A:
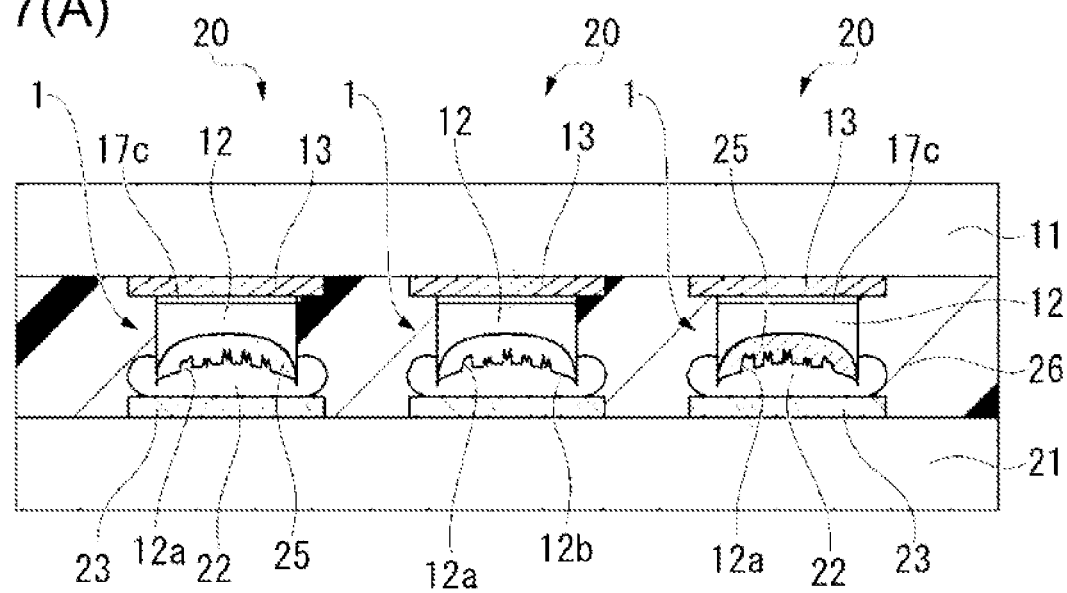
FIG. 7 (A) is a cross-sectional view illustrating an example of a bonded structure obtained by a method for manufacturing a bonded structure of the present embodiment.
FIG. 7(B) is a cross-sectional view illustrating another example of a bonded structure obtained by a method for manufacturing a bonded structure of the present embodiment.
Figure 9A:
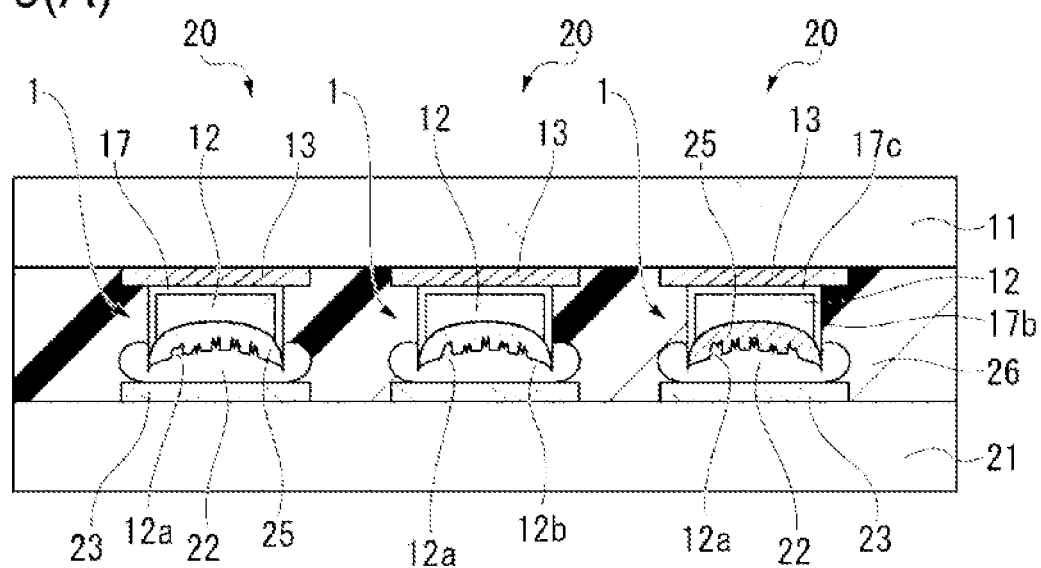
FIG. 9(A) is a cross-sectional view illustrating an example of a bonded structure obtained by a method for manufacturing a bonded structure of the present embodiment.
Figure 9B:
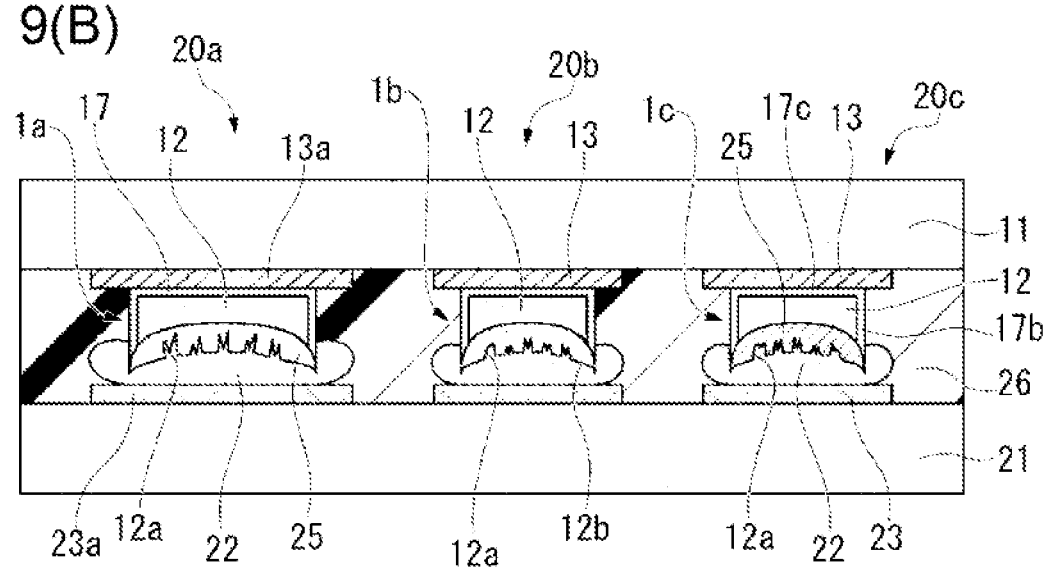
FIG. 9(B) is a cross-sectional view illustrating another example of a bonded structure obtained by a method for manufacturing a bonded structure of the present embodiment.

FIGS. 7(A) and 9(A) are cross-sectional views each illustrating an example of a bonded structure obtained by a method for manufacturing a bonded structure of the present embodiment.

As illustrated in FIGS. 7(A) and 9(A), a sealing resin 26 is filled into a region where the bonded structures 20 are not arranged between the substrate 11 and the bonding member 21. As a method for filling the sealing resin 26, a conventionally known method can be used.

As illustrated in FIGS. 7(A) and 9(A), the region where the bonded structures 20 are not arranged between the substrate 11 and the bonding member 21 is filled with the sealing resin 26. As the material of the sealing resin 26, a conventionally known material, such as epoxy resin, can be used.

FIGS. 7(A) and 9(A) are cross-sectional views each illustrating an example of a bonded structure obtained by a method for manufacturing a bonded structure of the present embodiment.

As illustrated in each of FIGS. 7(A) and 9(A), the case where the three bonded structures 20, in which the substrate 11 and the bonding member 21 are arranged so as to face each other, all have substantially the same shape, has been described as an example. However, when multiple bonded structures of the present embodiment are provided between the substrate 11 and the bonding member 21, some or all of the multiple bonded structures may have different shapes. That is, the shape of the conductive pillar and the second bonding layer of each bonded structure can be appropriately determined in accordance with the planar shapes of the electrode pad on the substrate 11 and the electrode of the bonding member 21.

Figure 7B:
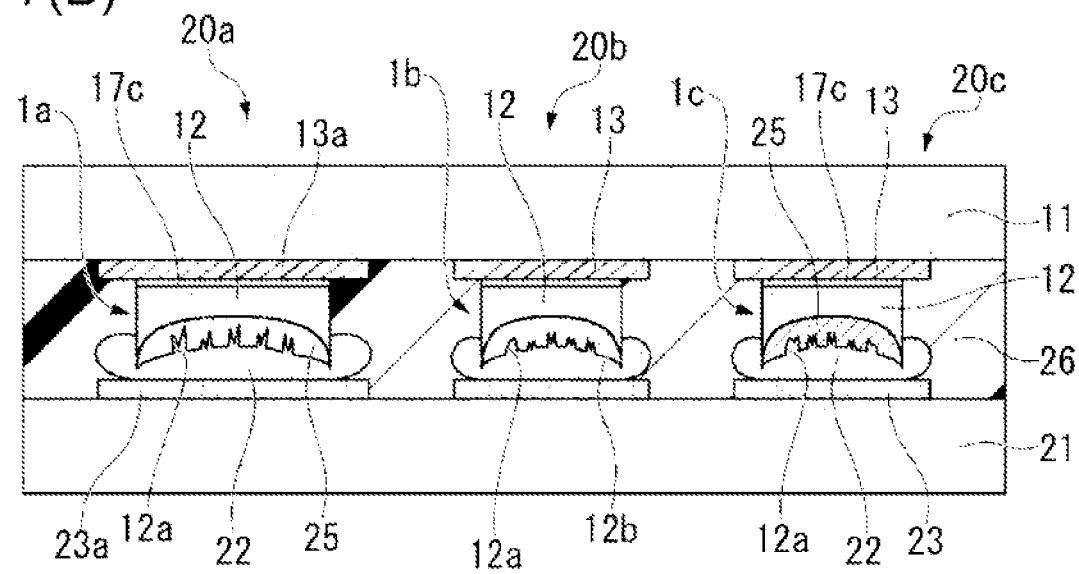

FIG. 7(B) is a cross-sectional view illustrating another example of a bonded structure of the present embodiment. The only difference between the example illustrated in FIG. 7(B) and the example illustrated in FIG. 7(A) is the shape of the bonded structure. For this reason, in FIG. 7(B), the same members as those in FIG. 7(A) are designated using the same reference numerals, and the description thereof will be omitted.

FIG. 9(B) is a cross-sectional view illustrating another example of a bonded structure of the present embodiment. The only difference between the example illustrated in FIG. 9(B) and the example illustrated in FIG. 9(A) is the shape of the bonded structure. For this reason, in FIG. 9(B), the same members as those in FIG. 9(A) are designated using the same reference numerals, and the description thereof will be omitted.

As illustrated in FIGS. 7(B) and 9(B), multiple (three in the examples illustrated in FIGS. 7(B) and 9(B)) bonded structures 20a, 20b, and 20c are provided between the substrate 11 and the bonding member 21. In the bonded structures 20a, 20b, and 20c illustrated in FIGS. 7(B) and 9(B), the planar shape of the bonded structure 20a, which is one of the three bonded structures 20a, 20b, and 20c, is larger than the other bonded structures 20b and 20c, and the other bonded structures 20b and 20c have the same shape.

More specifically, as illustrated in FIGS. 7(B) and 9(B), the planar shapes of the electrode pad 13a and the electrode 23a in contact with the bonded structure 20a, which is one of the three bonded structures 20a, 20b, and 20c, are larger than those of the other electrode pads 13 and electrodes 23. Accordingly, the outside diameter (diameter) of the substantially cylindrical conductive pillar 1a of the bonded structure 20a is larger than those of the other conductive pillars 1b and 1c. In addition, the size of the second bonding layer 22 of the bonded structure 20a is also larger than that of the second bonding layers 22 of the other bonded structures 20b and 20c. As illustrated in FIGS. 7(B) and 9(B), the distance between the substrate 11 and the bonding member 21 is substantially constant. At the three bonded structures 20a, 20b, and 20c, the length of the substrate 11 in the thickness direction is substantially the same.

The three bonded structures 20a, 20b, and 20c illustrated in FIGS. 7(B) and 9(B) can be simultaneously manufactured in the same way as in the three bonded structures 20 illustrated in FIGS. 7(A) and 9(A), except that resist opening portions having shapes corresponding to the outer shapes of the conductive pillars 1a, 1b, and 1c are formed in the step of patterning the resist layer 16. Accordingly, there is no difference in the dimensional accuracy and the number of manufacturing steps between the case of manufacturing the three bonded structures 20a, 20b, and 20c illustrated in FIGS. 7(B) and 9(B) and the case of manufacturing the three bonded structures 20 illustrated in FIGS. 7(A) and 9(A).

In contrast, for example, when multiple copper pillars are formed on a substrate by an electroplating method, if the multiple copper pillars include copper pillars having different shapes, the following inconveniences will occur. That is, the plating rate may be difficult to control, resulting in insufficient dimensional accuracy of the copper pillars. In addition, all copper pillars cannot be formed simultaneously, which can make the manufacturing process very complicated. Thus, in the case of forming multiple copper pillars on a substrate by an electroplating method, it is difficult to provide multiple copper pillars including copper pillars having different shapes.

Although FIGS. 7(B) and 9(B) each illustrate three bonded structures 20a, 20b, and 20c disposed between the substrate 11 and the bonding member 21, the number of bonded structures 20a, 20b, and 20c disposed between the substrate 11 and the bonding member 21 is not limited to three, and may be, for example, only two bonded structures 20a and 20b or may be four or more, and is determined as necessary.

In FIGS. 7(B) and 9(B), the case where the planar shapes of the conductive pillars 1a, 1b, and 1c are all substantially circular shapes has been described as an example. However, the planar shape of each conductive pillar is not limited to a substantially circular shape and can be appropriately determined in accordance with, for example, the planar shape of the electrode pad 13. In FIGS. 7(B) and 9(B), the case where the substrate 11 has substantially the same length in the thickness direction at the three bonded structures 20a, 20b, and 20c has been described as an example. However, the substrate 11 may have different lengths in the thickness direction in at the bonded structures partially or entirely.

The method of manufacturing a bonded structure of the present embodiment enables the manufacture of an electronic device including the bonded structure 20. The electronic device of the present embodiment preferably includes multiple bonded structures 20. In this case, a part or all of the multiple bonded structures 20 may have different shapes.

Specific examples of the electronic apparatus according to the present embodiment include a device having a three-dimensional (3D) mounting structure including multiple bonded structures 20 according to the present embodiment and a device having a 2.5 dimensional (2.5D) mounting structure using an interposer including multiple bonded structures 20 according to the present embodiment.

Since the electronic device of the present embodiment includes the bonded structure 20 of the present embodiment, the substrate 11 and the bonding member 21 are bonded with high bonding strength.

EXAMPLES

Hereinafter, the present invention will be described more specifically with reference to Examples. The present invention is not limited only to the following Examples.

[Production of Fine Particle Copper Paste]

As the fine particle copper paste used for the manufacture of the conductive pillar, a paste containing a composite of fine copper particles and a dispersant and a solvent was produced by the following method.

<Production of Aqueous Dispersion of Composite>

A mixture of copper(II) acetate monohydrate (3.00 g, 15.0 mmol) (available from Tokyo Chemical Industry Co., Ltd.), ethyl 3-(3-(methoxy(polyethoxy)ethoxy)-2-hydroxypropylsulfanyl)propionate [an addition compound of ethyl 3-mercaptopropionate to polyethylene glycol methyl glycidyl ether (molecular weight of polyethylene glycol chain: 2,000 (91 carbon atoms)] represented by formula (1) (0.451 g), and ethylene glycol (10 mL) (available from Kanto Chemical Co., Inc.) was deaerated by heating under stirring at 125° C. for 2 hours with nitrogen blown thereinto at a flow rate of 50 mL/min. The mixture was brought to room temperature. A dilute solution of hydrazine hydrate (1.50 g, 30.0 mmol) (available from Tokyo Chemical Industry Co., Ltd.) diluted with 7 mL of water was slowly added dropwise using a syringe pump. About ¼ of the volume of the dilute solution was slowly added dropwise over a period of 2 hours. The dropwise addition was temporarily stopped here. After stirring for 2 hours to confirm that foaming had subsided, the remaining volume was added dropwise over another 1 hour. The resulting brown solution was heated to 60° C. and stirred for another 2 hours to terminate the reduction reaction.

The resulting reaction mixture was then circulated through a hollow-fiber ultrafiltration membrane module (HIT-1-FUS1582, 145 cm$^2$, molecular weight cutoff: 150,000) available from Daicen Membrane-Systems Ltd. While adding a 0.1% aqueous solution of hydrazine hydrate in an amount equal to that of the filtrate leached, the solution was circulated and purified until the filtrate from the ultrafiltration module reached about 500 mL. The supply of the 0.1% aqueous solution of hydrazine hydrate was stopped. The solution was concentrated by ultrafiltration to give 2.85 g of an aqueous dispersion of a composite of a thioether-containing organic compound and fine copper particles. The resulting aqueous dispersion had a non-volatile content of 16%.

<Preparation of Fine Particle Copper Paste>

In a 50-mL three-necked flask, 5 mL of the above aqueous dispersion was sealed. Nitrogen gas was allowed to flow at a flow rate of 5 mL/min under reduced pressure while the aqueous dispersion was heated to 40° C. with a water bath, to completely remove water, thereby providing 1.0 g of a fine particle copper composite as a dry powder. Ethylene glycol that had been subjected to nitrogen bubbling for 30 minutes in a glove bag filled with argon gas was added to the resulting dry powder of the fine particle copper composite in such a manner that the fine particle copper composite content was 70% based on 100% of the fine particle copper paste. Thereafter, the mixture was kneaded in an agate mortar for 3 minutes in the atmosphere to prepare a fine particle copper paste having a fine particle copper composite content of 70%. The physical properties of the prepared fine particle copper paste were evaluated by the following methods.

<Measurement of Weight Loss Rate by Thermogravimetric Analysis (TG-DTA)>

From 2 to 25 mg of the dry powder of the synthesized fine particle copper composite was accurately weighed onto an aluminum pan for thermogravimetric analysis and placed on an EXSTAR TG/DTA6300 model differential thermogravimetric analyzer (available from SII NanoTechnology Inc). Then, the temperature was raised from room temperature to 600° C. at a rate of 10° C. per minute in an inert gas atmosphere. The weight loss rate was measured from 100° C. to 600° C. The results revealed that an organic substance containing a polyethylene oxide structure was present in the dry powder of the fine particle copper composite in an amount of 3%.

<Measurement of Average Primary Particle Size>

The average primary particle size of the synthesized fine particle copper composite was measured by observation with a transmission electron microscope (TEM). First, the dry powder of the synthesized fine particle copper composite was diluted 100 times with water to prepare a dispersion. The dispersion was cast on a carbon film-coated grid, dried, and observed with a transmission electron microscope (TEM) (Model: TEMJEM-1400 (available from JEOL Ltd.), accelerating voltage: 120 kV). Then, 200 fine particle copper composite particles were randomly selected from the obtained TEM images, the area of each of the composite particles was determined, and the particle size in terms of a true sphere was calculated on a number basis to determine the average primary particle size. The synthesized fine particle copper composite had an average primary particle size of 42 nm.

<Measurement of Average Particle Size of Fine Copper Particles Forming Conductive Pillar>

A sintered body of the fine particle copper paste prepared by the above-described method was formed by simulating a method for manufacturing a conductive pillar in Examples described below. Specifically, the fine particle copper paste prepared by the above-described method was uniformly applied to a silicon wafer in an argon gas atmosphere to a thickness of 1 mm.

Next, pre-baking was performed to evaporate the solvent in the fine particle copper paste applied to the silicon wafer at a low temperature. The pre-baking was performed by heating the silicon wafer, to which the fine particle copper paste had been applied, at 120° C. for 5 minutes in a nitrogen gas atmosphere using a table-top vacuum reflow solder system (available from Unitemp).

The fine particle copper paste applied to the silicon wafer was then sintered to form a sintered body. The sintering of the fine particle copper paste was performed by heating the pre-baked silicon wafer at 250° C. for 10 minutes in a nitrogen atmosphere containing formic acid vapor using the table-top vacuum reflow solder system (available from Unitemp).

The resulting sintered body was scraped off from the silicon wafer to collect the powder of the fine particle copper sintered body. The average particle size of the collected fine particle copper sintered body was measured by small-angle X-ray scattering (SAXS). The result can be regarded as the average particle size of the fine metal particles forming conductive pillars in Examples described below.

An X-ray diffraction apparatus (trade name: SmartLab) available from Rigaku Corporation was used to measure the average particle size of the fine copper particles in the sintered body. The measurement was performed in a step mode at a diffraction angle 2θ ranging from 0° to 4°. The step angle was 0.005°, and the measurement time was 5 seconds.

Figure 10:
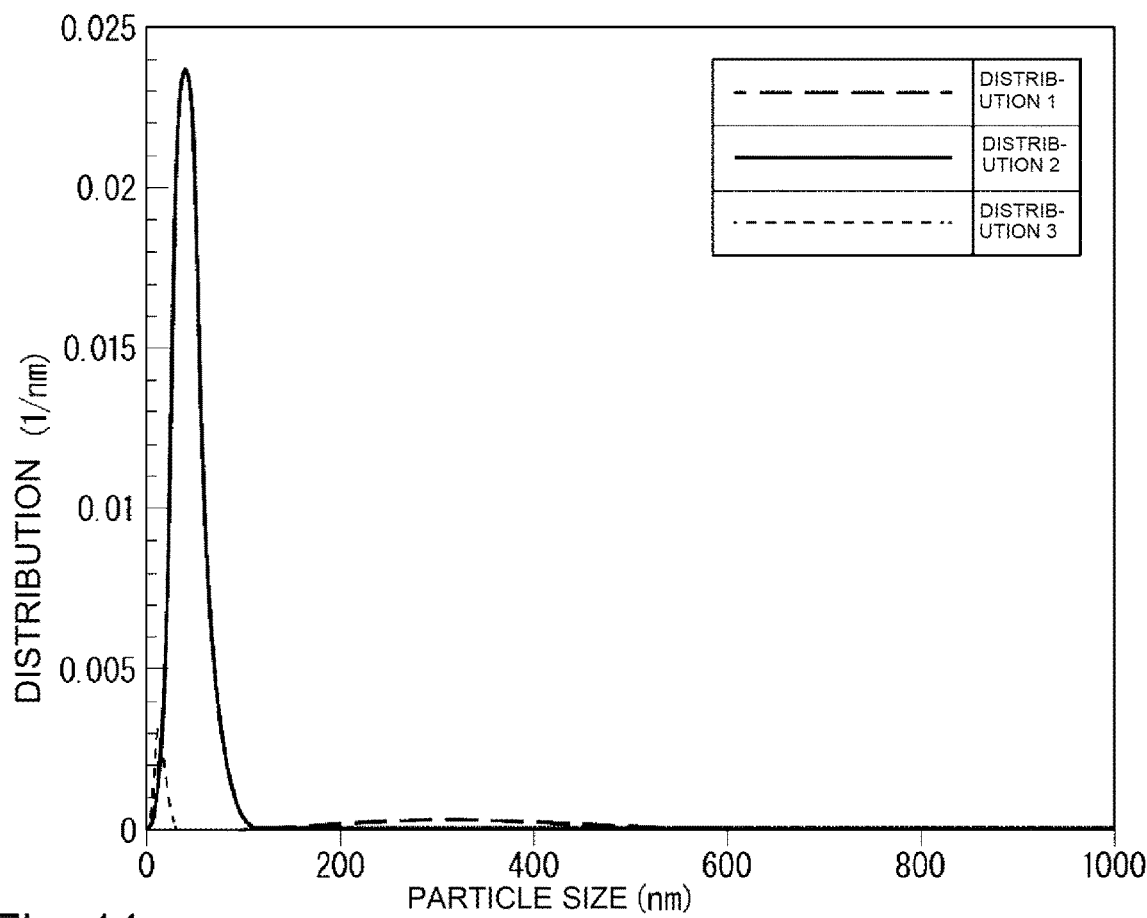
FIG. 10 is a graph illustrating the particle size distribution of fine copper particles.

The average particle size of the fine copper particles was estimated by calculating the measurement data obtained by SAXS using analysis software (NANO-Solver Ver. 3). FIG. 10 presents the results. FIG. 10 is a graph illustrating the particle size distribution of the fine copper particles. As illustrated in FIG. 10, the particle size of the fine copper particles in the sintered body was 322 nm (distribution 1) for a volume fraction of 6%, 45 nm (distribution 2) for a volume fraction of 91%, and 15 nm (distribution 3) for a volume fraction of 4%. From the results, the average particle size of the fine copper particles in the sintered body was estimated to be 59.112 nm.

Example 1

<Production of Conductive Pillar>

A silicon wafer (substrate 11) having a diameter of 4 inches and including Al electrode pads 13 was cleaned by reverse sputtering in which Ar gas was used for bombardment with positive Ar ions. Then the thin Cu film 17 having a thickness of 250 nm was formed by sputtering FIG. 1(A)).

A resist resin was applied so as to have a final thickness of 30 μm. The resist was exposed and developed to form multiple opening patterns in the resist layer 16 in such a manner that opening portions 16a were provided above the Al electrode pads (FIG. 1(B)). The shapes of the opening patterns of the resist layer 16 were a cylindrical shape in which each of the upper and lower surfaces had a diameter of 30 to 75 μm and a quadrangular prism-shaped concave portion having square upper and lower surfaces each having a length of 30 to 75 μm per side, and the opening portions had a depth of 30 μm. The aspect ratio (depth:diameter) of the opening portions having the cylindrical shape was designed to be 1.0:1.0 to 2.5.

According to a method described below, the fine particle copper paste prepared by the above-described method was filled into the cylindrical and quadrangular prism-shaped opening portions to form columnar bodies composed of the fine particle copper paste 12c in the opening portions 16a above the substrate 11 (FIG. 1(C)). The filling of the fine particle copper paste was performed in an argon gas atmosphere. The filling of the fine particle copper paste was performed by a method in which the fine particle copper paste was placed on the substrate, and a squeeze attached to a semi-automatic screen printer (available from Seria Corporation) was swept once back and forth on the substrate at an attack angle of 70° and a moving speed of 10 mm/s. As the squeegee, a square squeegee composed of urethane rubber having a hardness of 70° was used.

The substrate on which the cylindrical bodies composed of the fine particle copper paste 12c had been formed was exposed to a nitrogen atmosphere containing formic acid vapor at a temperature of 250° C. for 10 minutes with a hot plate, thereby sintering the fine particle copper paste (FIG. 1(D)).

The substrate that had been filled with the conductive paste and sintered was immersed in a copper etching agent (WLC-C2, available from Ryoko Chemical Co Ltd.) for 30 seconds to remove the residue of the fine particle copper paste left on the surface of the outermost layer over the substrate.

Through the above steps, conductive pillars of Example 1 were obtained (FIG. 1(D)).

As illustrated in FIG. 1(D), each of the conductive pillars of Example 1 includes the sintered body 12 of fine copper particles provided over the electrode pad 13 on the substrate 11 via the first bonding layer 17c formed of the thin Cu film 17. The sintered body 12 has a porous structure in which the fine copper particles coalesce through sintering and has a concave shape with the upper surface 12b recessed toward the substrate 11.

Figure 11:
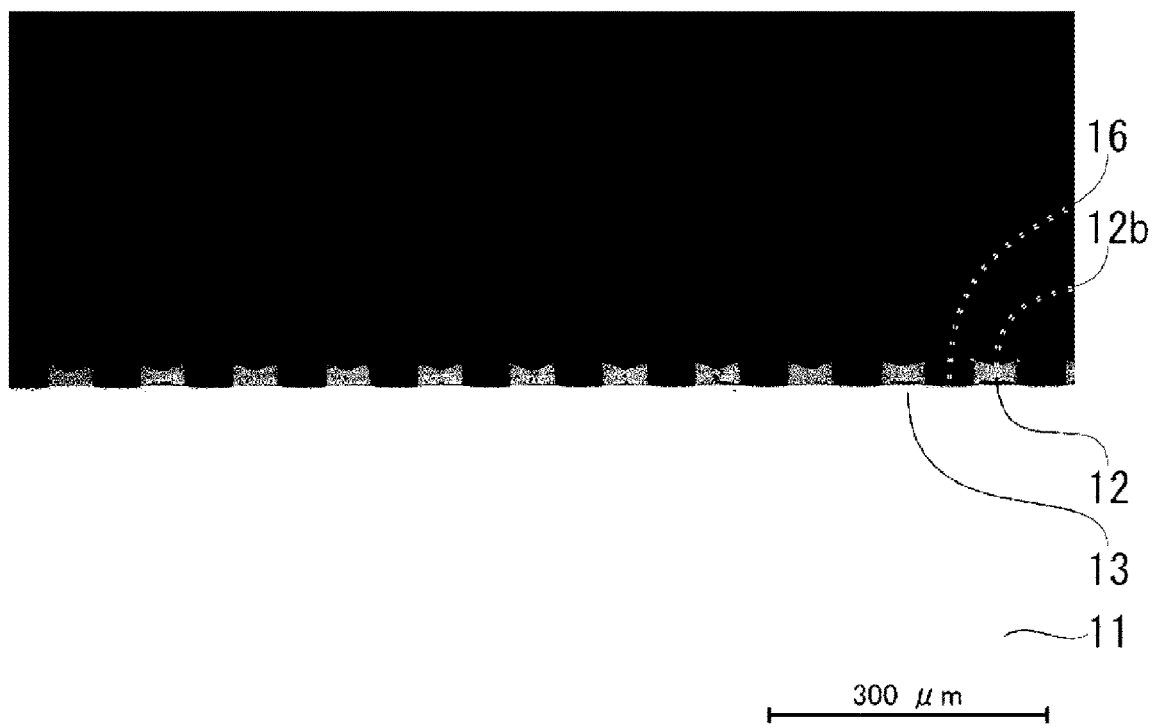
FIG. 11 is a photomicrograph of the cross sections of conductive pillars of Example 1.
Figure 12:
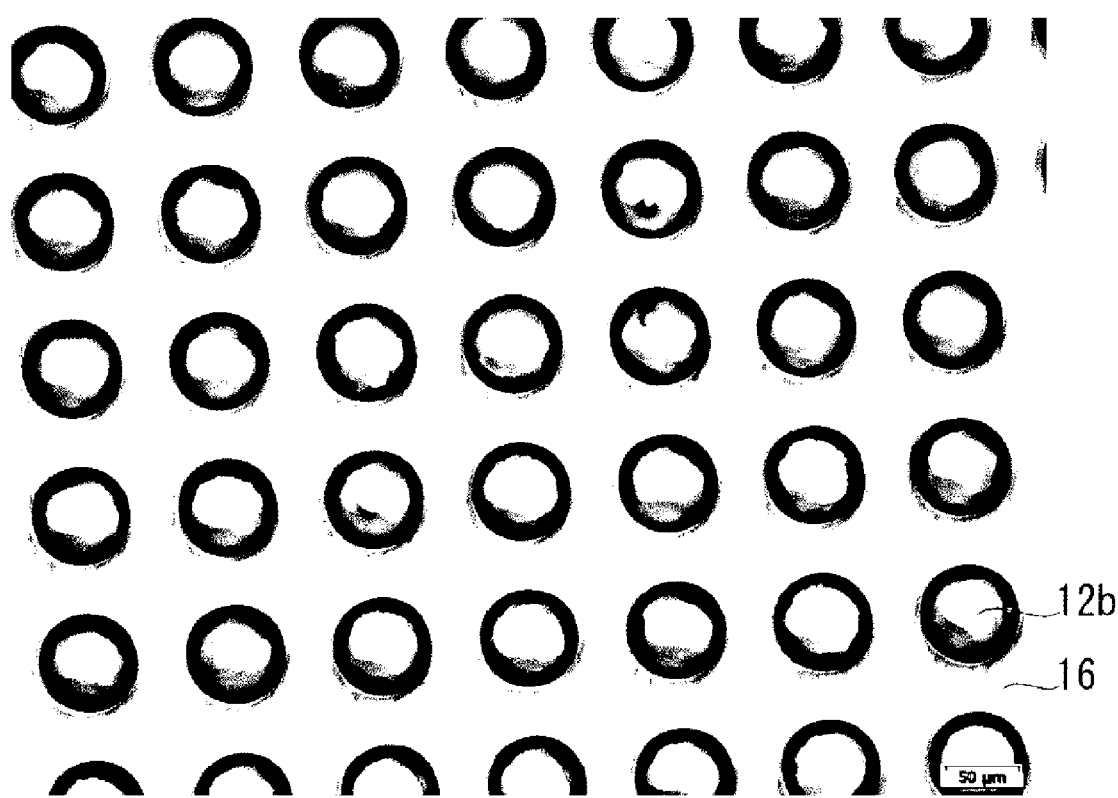
FIG. 12 is a photomicrograph of the upper surfaces of the conductive pillars of Example 1.

FIG. 11 is a photomicrograph of a cross section of the conductive pillars of Example 1 in which the shape of the opening pattern is a cylindrical shape with the upper and lower surfaces each having a diameter of 50 μm. FIG. 12 is a photomicrograph of the upper surfaces of the conductive pillars illustrated in FIG. 11.

In FIGS. 11 and 12, reference numeral 11 denotes a substrate, reference numeral 12 denotes a sintered body, reference numeral 12b denotes the upper surface of the sintered body, and reference numeral 13 denotes an electrode pad. As illustrated in FIG. 11, each of the conductive pillars (sintered bodies 12) of this example had the upper surface 12b with a concave shape recessed toward the substrate 11.

Example 2

<Production of Conductive Pillar>

Molten solder (SAC305) serving as the material 22a to be formed into the second bonding layers 22 was supplied to the concave shape, recessed toward the substrate, of the sintered bodies forming the conductive pillars of Example 1 by an injection molded soldering (IMS) process (for example, see Japanese Unexamined Patent Application Publication No. 2015-106617), thereby providing bumps along the concave shape of the sintered bodies. Specifically, the molten solder was directly supplied by injection from the injection head 22b (reservoir) configured to hold the molten solder to the opening portions (FIG. 6(A)). SAC305 was used as the solder alloy. Thereby, the second bonding layers (bumps) composed of a solder alloy were produced. The resulting second bonding layers had a convexly protruding shape. Then, the resist layer was removed. The thin Cu films 17d, under the resist layer 16, exposed on the substrate were etched away by immersion in a copper etching agent (WLC-C2, available from Ryoko Chemical Co Ltd.) for 15 seconds, thereby providing conductive pillars of Example 2 (FIG. 6(B)).

Each of the conductive pillars of Example 2 was provided over the Al electrode pad on the substrate via the thin Cu film (first bonding layer 17c) having a thickness of 250 nm. The height of the pillar (height of the sintered body) was about 15 to about 20 μm. The thickness of the intermetallic compound layer was about 1 to about 5 μm. The height of the second bonding layer was about 5 to about 15 μm.

The conductive pillars have substantially the same diameter with respect to the diameter of the opening pattern of the resist layer. In the case of the conductive pillars in Example 2, the thin Cu film and the conductive pillars are composed of the same Cu. Accordingly, when the thin Cu film is etched, no undercut is formed.

(Evaluation Test of Bonding Strength (Share Strength) with Bump)

Among the conductive pillars of Example 2 obtained by removing the resist layer, quadrangular prism-shaped conductive pillars having square upper and lower surfaces each having a length of 75 μm per side were subjected to an evaluation test of bonding strength (shear strength) with bumps by an evaluation method described below.

Example 3

<Production of Bonded Structure>

A substrate on which second bonding layers (bumps) composed of a solder alloy were formed on the conductive pillars of Example 2 composed of sintered bodies and a Si substrate (bonding member) having electrodes composed of copper on a surface thereof were stacked so as to face each other. Specifically, the surface of the bonding member on which the electrodes were arranged was disposed facing upward, and the surface of the substrate on which the second bonding layers were arranged was disposed facing downward, so that the electrodes of the bonding member and the second bonding layers of the substrate were stacked (FIG. 6(C)). Then, the second bonding layers were melted by heating while the substrate and the bonding member were stacked, so that the substrate and the bonding member were bonded to each other to form bonded structures of Example 3. The height of the conductive pillars after chip assembly was 20 μm.

(Electrical Resistance Measurement and Insulation Reliability Test)

With respect to the bonded structures of Example 3 in which the substrate and the bonding member were bonded with the conductive pillars of Example 2, the measurement of the electrical resistance of the conductive pillars and an insulation reliability test were performed by evaluation methods described below.

Example 4

<Production of Bonded Structure>

A sealing resin was filled by a method for injecting an underfill agent composed of an epoxy resin into a region where the bonded structures were not disposed between the substrate and the bonding member, thereby providing bonded structures of Example 4 (FIGS. 7(A) and 7(B)).

The bonded structures each including the sintered body 12 as the conductive pillar and the second bonding layer 22 provided along the concave shape of the sintered body 12 were provided between the substrate 11 and the bonding member 21 (FIGS. 7(A) and 7(B)).

(Deep Thermal Cycle Test (DTC Test))

The bonded structures of Example 4 provided with the conductive pillars of Example 2 were subjected to a deep thermal cycle test (DTC test) according to an evaluation method described below.

(High Temperature Storage Test (HTS Test))

The bonded structures of Example 4 provided with the conductive pillars of Example 2 were subjected to a high temperature storage test (HTS test) according to an evaluation method described below.

Example 5

<Production of Conductive Pillar>

A resist resin was applied to a silicon wafer (substrate) having a diameter of 4 inches and including Al electrode pads so as to have a final thickness of 30 μm. The resist was exposed and developed to form multiple opening patterns in the resist layer in such a manner that opening portions were provided on the Al electrode pads (FIG. 3(A)). The shapes of the opening patterns were a cylindrical shape in which each of the upper and lower surfaces had a diameter of 20 to 75 μm and a quadrangular prism-shaped concave portion having square upper and lower surfaces each having a length of 20 to 75 μm per side, and the opening portions had a depth of 30 μm. The aspect ratio (depth:diameter) of the opening portions having the cylindrical shape was designed to be 1.0:1.0 to 2.5.

The surface of the silicon wafer provided with the resist layer including the opening portions on the Al electrodes was cleaned by reverse sputtering in which Ar gas was used for bombardment with positive Ar ions. Then a thin Cu film having a thickness of 250 nm was formed by sputtering (FIG. 3(B)). The shape of the aperture pattern remained largely unchanged.

According to a method described below, the fine particle copper paste prepared by the above-described method was filled into the cylindrical and quadrangular prism-shaped opening portions to form columnar bodies composed of fine copper particles on the substrate (FIG. 3(C)). The filling of the fine particle copper paste was performed in an argon gas atmosphere. The filling of the fine particle copper paste was performed by a method in which the fine particle copper paste was placed on the substrate, and a squeeze attached to a semi-automatic screen printer (available from Seria Corporation) was swept on the substrate at an attack angle of 70° and a moving speed of 10 mm/s (FIG. 3(C)). As the squeegee, a square squeegee composed of urethane rubber having a hardness of 70° for screen printing was used.

The substrate on which the columnar bodies had been formed was exposed to a nitrogen atmosphere containing formic acid vapor at a temperature of 250° C. for 10 minutes with a hot plate, thereby sintering the fine particle copper paste (FIG. 3(D)).

The substrate that had been filled with the conductive paste and sintered was immersed in a copper etching agent (WLC-C2, available from Ryoko Chemical Co Ltd.) for 30 seconds to remove the residue of the fine particle copper paste left on the surface of the outermost layer over the substrate and the thin Cu film 17a on the upper portion of the resist layer.

Through the above steps, conductive pillars of Example 5 composed of the sintered bodies provided on the substrate was obtained (FIG. 4).

As illustrated in FIG. 5, each of the conductive pillars of Example 5 was composed of the sintered body 12 of fine Cu particles provided on the substrate 11, the sintered body 12 had a porous structure in which the fine copper particles coalesced through sintering, the upper surface 12b thereof had a concave shape recessed toward the substrate 11, and the side surface of the sintered body 12 was covered with the thin Cu film.

Example 6

<Production of Conductive Pillar>

Molten solder (SAC305) was supplied to the concave shape, recessed toward the substrate, of the sintered bodies forming the conductive pillars of Example 1 by the IMS process, thereby providing bumps along the concave shape of the sintered bodies. Specifically, the molten solder was directly supplied by injection from the injection head (reservoir) configured to hold the molten solder to the opening portions (FIG. 8(A)). SAC305 was used as the solder alloy. Thereby, the second bonding layers (bumps) composed of a solder alloy were produced. The resulting second bonding layers had a convexly protruding shape. Then, the resist layer was removed to obtain conductive pillars of Example 2 (FIG. 8(B)).

Each of the conductive pillars of Example 6 was provided over the Al electrode pad on the substrate via the thin Cu film (first bonding layer) having a thickness of 250 nm, the side surface of the sintered body was covered with the thin Cu film, the height of the pillar (height of the sintered body) was about 15 to about 20 μm, the intermetallic compound layer was about 1 to about 5 μm, and the second bonding layer was about 5 to about 15 μm.

In the method for manufacturing a conductive pillar of Example 6, the thin Cu film is formed on the surface of the substrate provided with the resist layer including the opening portions, and the thin Cu film does not present on the exposed substrate 11 after the step of removing the resist layer. Moreover, there is no need to further provide an etching step for removing the thin Cu film, so that no undercut is formed.

The conductive pillars have substantially the same diameter with respect to the diameter of the opening pattern.

(Evaluation Test of Bonding Strength (Share Strength) with Bump)

Among the conductive pillars of Example 6 obtained by removing the resist layer, quadrangular prism-shaped conductive pillars having square upper and lower surfaces each having a length of 75 μm per side was subjected to an evaluation test of bonding strength (shear strength) with a bump by an evaluation method described below.

Example 7

<Production of Bonded Structure>

A substrate on which second bonding layers (bumps) composed of a solder alloy was formed on the conductive pillars, composed of sintered bodies, of Example 6 and a Si substrate (bonding member) having electrodes composed of copper on a surface thereof were stacked so as to face each other. Specifically, the surface of the bonding member on which the electrodes were arranged was disposed facing upward, and the surface of the substrate on which the second bonding layers were arranged was disposed facing downward, so that the electrodes of the bonding member and the second bonding layers of the substrate were stacked (FIG. 8(C)). Then, the second bonding layers were melted by heating while the substrate and the bonding member were stacked, so that the substrate and the bonding member were bonded to each other to form bonded structures of Example 7. The height of the conductive pillars after chip assembly was 20 μm.

(Electrical Resistance Measurement and Insulation Reliability Test)

With respect to the bonded structures of Example 7 in which the substrate and the bonding member were bonded with the conductive pillars of Example 6, the measurement of the electrical resistance of the conductive pillars and an insulation reliability test were performed by evaluation methods described below.

Example 8

<Production of Bonded Structure>

A sealing resin was filled by a method for injecting an underfill agent composed of an epoxy resin into a region where the bonded structures were not disposed between the substrate and the bonding member, thereby providing bonded structures of Example 8 (FIGS. 9(A) and 9(B)).

The bonded structures each including the sintered body 12 as the conductive pillar and the bonding layer 22 provided along the concave shape of the sintered body 12 were provided between the substrate 11 and the bonding member 21 (FIGS. 9(A) and 9(B)).

(Deep Thermal Cycle Test (DTC Test))

A deep thermal cycle test (DTC test) was performed for the bonded structures of Example 8 provided with the conductive pillars of Example 6 by an evaluation method described below.

(High Temperature Storage Test (HTS Test))

The bonded structures of Example 8 provided with the conductive pillars of Example 6 were subjected to a high temperature storage test (HTS test) according to an evaluation method described below.

Comparative Example 1

<Production of Conductive Pillar>

The entire surface of the silicon wafer (substrate) having a diameter of 4 inches and including Al electrodes was cleaned by reverse sputtering in which Ar gas was used for bombardment with positive Ar ions. Then a thin Cu film having a thickness of 250 nm was formed by sputtering.

When an attempt is made to supply molten solder directly on the Al electrodes, the Al electrodes does not have wettability with the molten solder. The reason why the formation of a thin Cu film is essential is its good wettability with molten solder.

A resist resin was applied thereto so as to have a final thickness of 30 μm. The resist was exposed and developed to form multiple opening patterns in such a manner that opening portions were provided on the Al electrodes. The shapes of the opening patterns of the resist layer were a cylindrical shape in which each of the upper and lower surfaces had a diameter of 30 to 75 μm and a quadrangular prism-shaped concave portion having square upper and lower surfaces each having a length of 30 to 75 μm per side, and the opening portions had a depth of 30 μm. The aspect ratio (depth:diameter) of the opening portions having the cylindrical shape was designed to be 1.0:1.0 to 2.5.

Molten solder was directly supplied by injection from an injection head (reservoir) configured to hold the molten solder to the opening portions using an IMS process. SAC305 was used as the solder alloy. Thereby, conductive pillars composed of only a solder alloy were produced. The solidified solder alloy exhibited a shape in which a head portion thereof was raised in a convex shape due to a difference in surface energy between the solder alloy and the resist layer. Thereafter, the resist layer was removed. Then the exposed thin Cu film was etched away by immersion in a copper etching agent (WLC-C2, available from Ryoko Chemical Co Ltd.) to obtain conductive pillars of Comparative example 1.

In Comparative example 1, the thin Cu film was formed on the entire surface of the substrate, and then the resist patterns were formed thereon. The thin Cu film was located under the solder alloy. For this reason, when the thin Cu film was etched after resist stripping, the solder alloy did not leach out, whereas the thin Cu film under the conductive pillars leached out along with the exposed thin Cu film, thereby forming undercuts.

(Evaluation Test of Bonding Strength (Share Strength) with Bump)

Among the conductive pillars of Comparative example 1, the conductive pillars being composed of only the solder alloy and formed on the Al electrodes on the substrate, the quadrangular prism-shaped conductive pillars having square upper and lower surfaces each having a length of 75 μm per side was subjected to an evaluation test of bonding strength (shear strength) with bumps by an evaluation method described below.

Comparative Example 2

<Production of Bonded Structure>

A substrate on which the conductive pillars of Comparative example 1 were formed and a Si substrate (bonding member) having electrodes composed of copper on a surface thereof were stacked so as to face each other. Specifically, the surface of the bonding member on which the electrodes were arranged was disposed facing upward, and the surface of the substrate on which the conductive pillars of Comparative example 1 were arranged was disposed facing downward, so that the electrodes of the bonding member and the conductive pillars, composed of only the solder alloy, of Comparative example 1 were stacked. Then, the solder alloy was melted by heating while the substrate and the bonding member were stacked, so that the substrate and the bonding member were bonded to each other to form bonded structures of Comparative example 2. The height of the conductive pillars after chip assembly was 15 pam.

(Electrical Resistance Measurement and Insulation Reliability Test)

With respect to the bonded structures of Comparative example 2 in which the substrate and the bonding member were bonded with the conductive pillars of Comparative example 1, the measurement of the electrical resistance of the conductive pillars and an insulation reliability test were performed by evaluation methods described below.

Comparative Example 3

<Production of Bonded Structure>

A sealing resin was filled by a method for injecting an underfill agent composed of an epoxy resin into a region where the bonded structures were not disposed between the substrate and the bonding member, thereby providing bonded structures of Comparative example 3.

(Deep Thermal Cycle Test (DTC Test))

A deep thermal cycle test (DTC test) was performed for the bonded structures of Comparative example 3 provided with the conductive pillars of Comparative example 1 by an evaluation method described below.

(High Temperature Storage Test (HTS Test))

The bonded structures of Comparative example 3 provided with the conductive pillars of Comparative example 1 were subjected to a high temperature storage test (HTS test) according to an evaluation method described below.

Comparative Example 4

<Production of Conductive Pillar>

A thin Ti film having a thickness of 50 nm and a thin Cu film having a thickness of 250 nm were formed by sputtering on the entire surface of the silicon wafer (substrate) having a diameter of 4 inches and including Al electrodes. A resist resin was applied thereto so as to have a final thickness of 30 μm. The resist was exposed and developed to form multiple opening patterns in such a manner that opening portions were provided on the Al electrodes. The shapes of the opening patterns of the resist layer were a cylindrical shape in which each of the upper and lower surfaces had a diameter of 30 to 75 μm and a quadrangular prism-shaped concave portion having square upper and lower surfaces each having a length of 30 to 75 μm per side, and the opening portions had a depth of 30 μm. The aspect ratio (depth:diameter) of the opening portions having the cylindrical shape was designed to be 1.0:1.0 to 2.5.

The produced electrode substrate was subjected to pretreatment for removing an oxide film by immersion in 5 wt % sulfuric acid. After the pretreatment, a copper plating solution containing 65 g/L of copper sulfate pentahydrate, 170 g/L of sulfuric acid, and 70 mg/L of sodium chloride was prepared. The pretreated electrode substrate was immersed in the copper plating solution and polarized. The cathode electrode surface exposed in the pattern opening portions of the resist layer was subjected to copper plating to produce conductive pillars composed of copper plating.

Molten solder was directly supplied by injection from an injection head (reservoir) configured to hold the molten solder to the opening portions using an IMS process. SAC305 was used as the solder alloy. Thereby, conductive pillars composed of only a solder alloy was produced. The solidified solder alloy exhibited a shape in which a head portion thereof was raised in a convex shape due to a difference in surface energy between the solder alloy and the resist layer.

The resist layer was removed by etching. The exposed thin Cu film was removed by etching by immersion in a copper etching agent (WLC-C2, available from Ryoko Chemical Co Ltd). Finally, the exposed Ti thin film was etched away by immersion in a sputtered Ti etching agent for wafer bumps (WLC-T, available from Ryoko Chemical Co Ltd.) for 20 seconds to obtain conductive pillars of Comparative example 4. The conductive pillars of Comparative example 4 subjected to the evaluation had a cylindrical shape with a diameter of 75 μm and a pillar height of 20 μm. However, the layer portions of the thin Ti film were etched to have a small diameter, forming undercuts.

When the conductive pillars are formed by plating as in Comparative example 4, it is necessary to form the thin Cu film serving as the cathode electrode surface on the entire surface of the substrate. For this reason, etching after resist stripping results in the formation of undercuts.

(Evaluation Test of Bonding Strength (Share Strength) with Bump)

Among the conductive pillars of Comparative example 4, the conductive pillars being composed of only the copper plating and formed on the Al electrodes on the substrate, the quadrangular prism-shaped conductive pillars having square upper and lower surfaces each having a length of 75 μm per side was subjected to an evaluation test of bonding strength (shear strength) with bumps by an evaluation method described below.

Comparative Example 5

<Production of Bonded Structure>

A substrate on which bonding layers composed of a solder alloy was formed on the conductive pillars, composed of copper plating, of Comparative example 4 and a Si substrate (bonding member) having electrodes composed of copper on a surface thereof were stacked so as to face each other. Specifically, the surface of the bonding member on which the electrodes were arranged was disposed facing upward, and the surface of the substrate on which the bonding layers were arranged was disposed facing downward, so that the electrodes of the bonding member and the bonding layers of the substrate were stacked. Then, the bonding layers were melted by heating while the substrate and the bonding member were stacked, so that the substrate and the bonding member were bonded to each other to form bonded structures of Comparative example 5. The height of the conductive pillars after chip assembly was 20 μm.

(Electrical Resistance Measurement and Insulation Reliability Test)

With respect to the bonded structures of Comparative example 5 in which the substrate and the bonding member were bonded with the conductive pillars of Comparative example 4, the measurement of the electrical resistance of the conductive pillars and an insulation reliability test were performed by evaluation methods described below.

Comparative Example 6

<Production of Bonded Structure>

A sealing resin was filled by a method for injecting an underfill agent composed of an epoxy resin into a region where the bonded structures were not disposed between the substrate and the bonding member, thereby providing bonded structures of Comparative example 6.

(Deep Thermal Cycle Test (DTC Test))

A deep thermal cycle test (DTC test) was performed for the bonded structures of Comparative example 6 provided with the conductive pillars of Comparative example 4 by an evaluation method described below.

(High Temperature Storage Test (HTS Test))

The bonded structures of Comparative example 6 provided with the conductive pillars of Comparative example 4 were subjected to a high temperature storage test (HTS test) according to an evaluation method described below.

[Evaluation Method and Evaluation Result]

"Bonding strength with bump", "insulation reliability", "DTC durability", and "HTS durability" were evaluated by the following methods for the conductive pillars of Examples 2 and 6, the bonded structures of Examples 3, 4, 7, and 8, the conductive pillars of Comparative examples 1 and 4, and the bonded structures of Comparative Examples 2, 3, 5, and 6.

"Bonding Strength with Bump (Share Strength)"

Eight test pieces of quadrangular prism-shaped conductive pillars each having a height of 30 μm and a square upper and lower surfaces each having a length of 75 μm per side were collected from the conductive pillars of each of Examples 2 and 6 and Comparative examples 1 and 4. According to the method described in JIS Z 03918-5: 2003 "Test methods for lead-free solders", a shear force was applied to each test piece under the conditions of a height of 7 μm from the Al electrode and a speed of 200 μm/s, and the bonding strength (shear strength) with the bump was measured. Table 1 presents the measurement results of the average value and the standard deviation.

As presented in Table 1, the bonding strength (shear strength) between the conductive pillar in each of Examples 2 and 6 and the bump was superior to the bonding strength (shear strength) between the conductive pillar composed of only the solder alloy in Comparative example 1 and the bump, and was as excellent as the bonding strength (shear strength) between the conductive pillar composed of only the copper plating in Comparative example 4 and the bump.

TABLE 1

|  |  | Conductive pillar of Example 2 | Conductive pillar of Example 6 | Conductive pillar of Comparative example 1 | Conductive pillar of Comparative example 4 |
|---|---|---|---|---|---|
| Bonding strength with bump | MPa | 113 ± 6 | 113 ± 6 | 50 ± 6 | 110 ± 6 |

"Electrical Resistance of Conductive Pillar"

The bonded structures of the cylindrical conductive pillars having the upper and lower surfaces each having a diameter of 40 μm were sampled from the bonded structures of Example 3 using the conductive pillars of Example 2, the bonded structures of Example 7 using the conductive pillars of Example 6, the bonded structures of Comparative example 2 using the conductive pillars of Comparative example 1, and the bonded structures of Comparative example 5 using the conductive pillars of Comparative example 4. The electrical resistance was measured by the four-terminal method at 16 points of each line in which 80 or 82 conductive pillars were connected in series. The resistance value of each of the conductive pillars was determined from the average of values obtained by dividing the obtained resistance values by 80 or 82. The resistance of a portion of the connection circuit other than the conductive pillars is negligible because of its very low resistance. The average and standard deviation of the 16 measurements are presented in Table 2.

As presented in Table 2, the bonded structures of Examples 3 and 7 exhibited good conductivity equivalent to that of the bonded structures of Comparative example 2 and the bonded structures of Comparative example 5.

"Insulation Reliability"

The bonded structures of the cylindrical conductive pillars having the upper and lower surfaces each having a diameter of 40 μm were sampled from the bonded structures of Example 3 using the conductive pillars of Example 2, the bonded structures of Example 7 using the conductive pillars of Example 6, the bonded structures of Comparative example 2 using the conductive pillars of Comparative example 1, and the bonded structures of Comparative example 5 using the conductive pillars of Comparative example 4. The insulation reliability test (HAST test: highly accelerated storage test) was performed on each of the bonded structures. Each bonded structure was placed in an accelerated life tester (available from Hirayama Manufacturing Corporation, trade name: PL-422R8, conditions: 130° C./85% RH/100 hours, 3.7 V application) to obtain a test piece for the insulating reliability test. After the test piece was polished, an image of a cross section of the bonded portion was captured using a metallurgical microscope (BX60, available from Olympus Corporation) and evaluated. Using image processing software Adobe Photoshop, the corroded portion was identified by color tone correction and binarization, and the proportion of the corroded portion was calculated from the histogram. The semiconductor bonded portion between the two bumps of the bonded portions was defined as 100%, and a discolored portion within that range was calculated by the same method as described above. The case where the occupancy rate of the corroded portion (corrosion occurrence rate) was 20% or less was rated "A" (good, corrosion inhibited), and the case where the occupancy rate was more than 20% was rated "B" (poor). Table 2 presents the evaluation results.

As presented in Table 2, the bonded structures of Examples 3 and 7 were superior to the bonded structures of Comparative examples 2 and 5 in electrical resistance and insulation reliability.

TABLE 2

|  |  | Conductive pillar of Example 3 | Conductive pillar of Example 7 | Conductive pillar of Comparative example 2 | Conductive pillar of Comparative example 5 |
|---|---|---|---|---|---|
| Electrical resistance | mΩ | 15.5 ± 3.2 | 15.5 ± 3.2 | 200 ± 10 | 21.3 ± 3.0 |
| Insulation reliability |  | A | A | A | A |

(Deep Thermal Cycle Test (DTC Test))

Ten test pieces of the cylindrical conductive pillars each having the upper and lower surfaces each having a diameter of 40 μm were taken from each of the bonded structures of Example 4 using the conductive pillars of Example 2, the bonded structures of Example 8 using the conductive pillars of Example 6, the bonded structures of Comparative example 3 using the conductive pillars of Comparative example 1, and the bonded structures of Comparative example 6 using the conductive pillars of Comparative example 4. These test pieces were subjected to the deep thermal cycle test (DTC test).

After a moisture sensitivity level (MSL), the deep thermal cycle (DTC) test was performed. MSL was performed in a JDEC Level 3 (30° C./60% RH-after 196 hours, reflow Max. 260° C.×3 times). The DTC test was conducted at −55° C./125° C. The volume resistance (Ω) was measured at 0 cycles, after 500 cycles, and after 1,000 cycles. The rate of change (ΔR) with respect to the volume resistance (Ω) at 0 cycles was determined.

As presented in Table 3, in all of the bonded structures of Example 4 using the conductive pillars of Example 2, the bonded structure of Example 8 using the conductive pillars of Example 6, the bonded structure of Comparative example 3 using the conductive pillars of Comparative example 1, and the bonded structure of Comparative example 6 using the conductive pillars of Comparative example 4, ΔR<±2%, and all were good without defects.

(High Temperature Storage Test (HTS Test))

The cylindrical conductive pillars each having the upper and lower surfaces each having a diameter of 40 μm were taken from each of the bonded structures of Example 4 using the conductive pillars of Example 2, the bonded structures of Example 8 using the conductive pillars of Example 6, the bonded structures of Comparative example 3 using the conductive pillars of Comparative example 1, and the bonded structures of Comparative example 6 using the conductive pillars of Comparative example 4. These test pieces were subjected to the high temperature storage test (HTS test). Each test piece was exposed to a high-temperature environment at a temperature of 150° C. for 1,000 hours using a high-temperature thermostat. The test piece was taken out every 500 hours, and the resistance value was measured. The electrical resistance value of a line in which 80 or 82 conductive pillars were connected in series was measured by a four-terminal method, and the rate of change in electrical resistance (ΔR) was determined.

As shown in Table 3, in all the bonded structures of Example 4 using the conductive pillars of Example 2, the bonded structures of Example 8 using the conductive pillars of Example 6, the bonded structures of Comparative example 3 using the conductive pillars of Comparative example 1, and the bonded structures of Comparative example 6 using the conductive pillars of Comparative example 4, ΔR<±2%, which was good.

TABLE 3

| | | Bonded structure of Example 4 | Bonded structure of Example 8 | Bonded structure of Comparative example 3 | Bonded structure of Comparative example 6 |
|---|---|---|---|---|---|
| Deep thermal cycle test | 500 | ΔR < ±2% | ΔR < ±2% | ΔR < ±2% | ΔR < ±2% |
| | 1,000 | ΔR < ±2% | ΔR < ±2% | ΔR < ±2% | ΔR < ±2% |
| High temperature storage test (HTS test) | 500 hours later | ΔR < ±2% | ΔR < ±2% | ΔR < ±2% | ΔR < ±2% |
| | 1000 hours later | ΔR < ±2% | ΔR < ±2% | ΔR < ±2% | ΔR < ±2% |

As presented in Tables 1 to 3, the conductive pillars of the Examples have excellent bonding strength (shear strength) with the bumps; thus, the bonded structures of the Examples can bond the substrate and the bonding member with higher bonding strength. In addition, the bonded structures of the Examples exhibited good evaluation results in all of the electrical resistance, the insulation reliability, the deep thermal cycle test, and the high temperature storage test.

REFERENCE SIGNS LIST

1 conductive pillars, 11 substrate, 12 sintered bodies, 12a groove portion, 12b upper surface, 12c fine particle copper paste, 12d squeegee, 13 electrode pad, 16 resist layer, 16a opening portion, 17 thin Cu film, 17a thin Cu film on upper portion of resist layer, 17b thin Cu film on side surface of sintered body (thin Cu film on side surface of opening portion of resist layer), 17c first bonding layer (thin Cu film on electrode pad), 17d thin Cu film under resist layer, 20 bonded structure, 21 bonding member, 22 second bonding layer, 22b injection head, 23 electrode, 25 intermetallic compound layer, 26 sealing resin

The invention claimed is:

1. A method for manufacturing a conductive pillar including an electrode pad, a first bonding layer formed of a thin Cu film on the electrode pad, and a sintered body of fine copper particles on the first bonding layer, the method comprising, in sequence, the steps of:
   forming a thin Cu film by sputtering or evaporating Cu on a surface of a substrate provided with an electrode pad;
   forming a resist layer on the thin Cu film, the resist layer including an opening portion above the electrode pad;
   filling the opening portion with a fine particle copper paste; and
   sintering the fine particle copper paste by heating the substrate filled with the fine particle copper paste.

2. The method for manufacturing a conductive pillar according to claim 1, further comprising, after the step of sintering the fine particle copper paste, a step of removing a residue of the fine particle copper paste left on an outermost layer over the substrate.

3. The method for manufacturing a conductive pillar according to claim 2, wherein the step of removing the residue of the fine particle copper paste is wet etching.

4. The method for manufacturing a conductive pillar according to claim 1, further comprising, after the step of sintering the fine particle copper paste, a step of removing the resist layer and the exposed thin Cu film.

5. A method for manufacturing a bonded structure, comprising:
   providing the conductive pillar manufactured by the method according to claim 1;
   forming a second bonding layer in a concave formed by sintering the fine particle copper paste;
   bonding an electrode of a bonding member with the second bonding layer, thereby obtaining the bonded structure comprising the substrate, the pillar (1), the second bonding layer, and the bonding member, in this order.

6. The method for manufacturing a conductive pillar according to claim 1, further comprising, after the step of sintering the fine particle copper paste, a step of removing a residue of the fine particle copper paste left on an outermost layer over the substrate.

* * * * *